(12) United States Patent
Kitagawa

(10) Patent No.: US 11,191,201 B2
(45) Date of Patent: Nov. 30, 2021

(54) DATA CREATION DEVICE AND DATA CREATION METHOD

(71) Applicant: FUJI CORPORATION, Chiryu (JP)

(72) Inventor: Masahiro Kitagawa, Takahama (JP)

(73) Assignee: FUJI CORPORATION, Chiryu (JP)

( * ) Notice: Subject to any disclaimer, the term of this patent is extended or adjusted under 35 U.S.C. 154(b) by 177 days.

(21) Appl. No.: 16/491,009

(22) PCT Filed: Mar. 24, 2017

(86) PCT No.: PCT/JP2017/012115
§ 371 (c)(1),
(2) Date: Sep. 4, 2019

(87) PCT Pub. No.: WO2018/173279
PCT Pub. Date: Sep. 27, 2018

(65) Prior Publication Data
US 2020/0015397 A1 Jan. 9, 2020

(51) Int. Cl.
*H05K 13/08* (2006.01)

(52) U.S. Cl.
CPC ....... *H05K 13/0882* (2018.08); *H05K 13/085* (2018.08); *G05B 2219/35513* (2013.01)

(58) Field of Classification Search
CPC ............. H05K 13/0882; H05K 13/085; H05K 13/0408; G05B 2219/35513
See application file for complete search history.

(56) References Cited

FOREIGN PATENT DOCUMENTS

JP 2007-142216 A 6/2007

OTHER PUBLICATIONS

International Search Report dated Jun. 27, 2017 in PCT/JP2017/012115 filed on Mar. 24, 2017.

*Primary Examiner* — Christopher E. Everett
(74) *Attorney, Agent, or Firm* — Oblon, McClelland, Maier & Neustadt, L.L.P.

(57) ABSTRACT

A data creation device including a component data storage section to link in advance and store lead component shape data and multiple types of holding tools; a holding tool data storage section to store holding tool data including moving directions of the multiple holding tools and clamping directions for holding the lead component; a mounting data acquisition section to acquire mounting data including the types and mounting positions on the board of previously-attached components and lead components; an installation order determination section to extract, for each lead component according to a determined mounting order of lead components on the board based on shape data and mounting data of lead components, a holding tool to mount lead components without interfering with previously-attached components, and determine the installation order of holding tools; and an allocation data creation section to create allocation data according to the determined installation order.

6 Claims, 16 Drawing Sheets

FIG. 11

MOUNTING LEAD COMPONENT POSITION DATA — 301

| REFERENCE | REFERENCE COORDINATES | | ARRANGEMENT DIRECTION |
|---|---|---|---|
| | X-COORDINATE | Y-COORDINATE | |
| C1 | X11 | Y11 | HORIZONTAL |
| C2 | X12 | Y12 | HORIZONTAL |
| C3 | X13 | Y13 | HORIZONTAL |
| C4 | X14 | Y14 | VERTICAL |
| C5 | X15 | Y15 | VERTICAL |
| C6 | X16 | Y16 | VERTICAL |
| D1 | X21 | Y21 | HORIZONTAL |
| D2 | X22 | Y22 | HORIZONTAL |
| D3 | X23 | Y23 | HORIZONTAL |
| D4 | X24 | Y24 | HORIZONTAL |
| E1 | X31 | Y31 | HORIZONTAL |

FIG. 12

MOUNTING LEAD COMPONENT BOM DATA — 302

| REFERENCE | COMPONENT NUMBER |
|---|---|
| C1 | AA1 |
| C2 | AA1 |
| C3 | AA1 |
| C4 | AA1 |
| C5 | AA1 |
| C6 | AA1 |
| D1 | BB1 |
| D2 | BB1 |
| D3 | BB1 |
| D4 | BB1 |
| E1 | CC1 |

FIG. 13

COMPONENTS DATA

| RADIAL LEAD COMPONENT | | | HOLDING TOOL | | |
|---|---|---|---|---|---|
| COMPONENT NUMBER | COMPONENT SIZE | | LC-A | LC-B | LC-C |
| AA1 | OUTER DIAMETER: φ10mm HEIGHT: 12.5mm LEAD PITCH: 5mm | | ○ | ○ | ○ |
| BB1 | DIAMETER: φ13mm HEIGHT: 13mm LEAD PITCH: 5mm | | ○ | ○ | ○ |
| CC1 | LENGTH: 17.5mm WIDTH: 7mm HEIGHT: 5mm LEAD PITCH: 10mm | | ○ | × | ○ |
| ... | | | | | |

FIG. 14

TOOL DATA
─ 305

| HOLDING TOOL | MOVABLE DIRECTION AND MOVABLE DISTANCE | CLAMPING DIRECTION | CORRESPONDING LEAD PITCH |
|---|---|---|---|
| LC−A | LEFT-RIGHT 5mm | VERTICAL | 5 TO 12 mm |
| LC−B | REAR 10mm | HORIZONTAL | 5 mm |
| LC−C | REAR 10mm | VERTICAL | 5 TO 12 mm |

FIG. 15

PREVIOUSLY-ATTACHED COMPONENT POSITION DATA ─ 306

| REFERENCE | REFERENCE COORDINATES | | ARRANGEMENT DIRECTION |
|---|---|---|---|
| | X COORDINATE | Y COORDINATE | |
| H1 | X51 | Y51 | HORIZONTAL |
| H2 | X52 | Y52 | HORIZONTAL |
| J1 | X61 | Y61 | HORIZONTAL |
| J2 | X62 | Y62 | HORIZONTAL |
| J3 | X63 | Y63 | HORIZONTAL |
| J4 | X64 | Y64 | HORIZONTAL |

FIG. 16

PREVIOUSLY-ATTACHED COMPONENT BOM DATA ─ 307

| REFERENCE | COMPONENT NUMBER |
|---|---|
| H1 | AB1 |
| H2 | AB1 |
| J1 | AC1 |
| J2 | AC1 |
| J3 | AC1 |
| J4 | AC1 |

PREVIOUSLY-ATTACHED COMPONENT — 308

| COMPONENT NUMBER | COMPONENT SIZE |
|---|---|
| AB1 | LENGTH : 10mm  WIDTH : 7mm  HEIGHT : 4mm |
| AC1 | LENGTH : 11mm  WIDTH : 7mm  HEIGHT : 4mm |

FIG. 21

| MOUNTING ORDER | REFERENCE | COMPONENT NUMBER | HOLDING TOOL | | |
|---|---|---|---|---|---|
| | | | LC-A | LC-B | LC-C |
| 1 | C1 | AA1 | × | ○ | ○ |
| 2 | C2 | AA1 | × | ○ | ○ |
| 3 | C3 | AA1 | × | ○ | ○ |
| 4 | C4 | AA1 | × | ○ | ○ |
| 5 | C5 | AA1 | × | ○ | ○ |
| 6 | C6 | AA1 | × | ○ | ○ |
| 7 | D1 | BB1 | ○ | ○ | × |
| 8 | D2 | BB1 | × | ○ | × |
| 9 | D3 | BB1 | × | ○ | × |
| 10 | D4 | BB1 | × | ○ | × |
| 11 | E1 | CC1 | ○ | × | ○ |

FIG. 22

| MOUNTING ORDER | REFERENCE | COMPONENT NUMBER | HOLDING TOOL |
|---|---|---|---|
| 1 | C1 | AA1 | LC-B |
| 2 | C2 | AA1 | LC-B |
| 3 | C3 | AA1 | LC-B |
| 4 | C4 | AA1 | LC-B |
| 5 | C5 | AA1 | LC-B |
| 6 | C6 | AA1 | LC-B |
| 7 | D1 | BB1 | LC-B |
| 8 | D2 | BB1 | LC-B |
| 9 | D3 | BB1 | LC-B |
| 10 | D4 | BB1 | LC-B |
| 11 | E1 | CC1 | LC-C |

DATA CREATION DEVICE AND DATA CREATION METHOD

TECHNICAL FIELD

The present application relates to a data creation device and a data creation method of inserting a lead component into a board.

BACKGROUND ART

Conventionally, various techniques have been disclosed for mounting components on a board by separating multiple types of suction nozzles according to use. For example, Patent Literature 1 below describes an example of a component mounting method in which multiple types of nozzles capable for picking up a component of a type are assigned beforehand to each type of component, and multiple types of nozzles are used for one type of component to mount the component, the types of nozzles used being dependent on the use.

PATENT LITERATURE

Patent Literature 1: JP-A-2007-142216

BRIEF SUMMARY

Technical Problem

However, when leads of a lead component are held with a holding tool and mounted on a board, after the leads are inserted into through holes of the board, the component is pressed toward the board with a pusher in a state in which the holding tool has been moved in the left-right direction or the rear direction. Consequently, when the holding tool moves, the holding tool may come in contact with a previously-attached component or the like, which has been mounted previously, and the previously-attached component or the like may become damaged. Further, when mounting a component on a board while holding the leads with the holding tool, since the lead pitch differs depending on the component, it may become necessary to exchange the holding tool during mounting, which may lower the mounting efficiency.

The present disclosure has been made to solve the above-mentioned problems, and an object thereof is to provide a data creation device and a data creation method capable of increasing the efficiency of mounting a lead component on a board while holding the leads of the lead component with a holding tool.

Solution to Problem

In order to solve the above-mentioned problems, the present specification provides a data creation device configured to create allocation data indicating the installation order of holding tools, which is used in a mounting machine capable of installing any of multiple types of holding tools configured to hold leads of a lead component, the data creation device comprising: a component data storage section configured to link in advance and store lead component shape data for multiple types of lead components and multiple types of holding tools capable of holding the leads of a lead component; a holding tool data storage section configured to store holding tool data including moving directions of the multiple holding tools and clamping directions for holding the lead components; a mounting data acquisition section configured to acquire mounting data, including the types and loading positions on the board, of each of previously-attached components and the lead components; a mounting order determination section configured to determine the mounting order of the lead components on the board based on the shape data and the mounting data of the lead components; a holding tool extraction section configured to extract a holding tool, for each lead component, capable of mounting components, according to the mounting order determined by the mounting order determination section, without interfering with previously-attached components based on the holding tool data; an installation order determination section configured to determine the installation order of holding tools capable of mounting all the lead components according to the mounting order determined by the mounting order determination section based on the holding tool extracted by the holding tool extraction section; and an allocation data creation section configured to create the allocation data according to the installation order determined by the installation order determination section.

In order to solve the above problems, the present specification provides a data creation method of creating allocation data indicating the installation order of holding tools, which is used in a mounting machine capable of installing any of multiple types of holding tools configured to hold leads of a lead component, the data creation method comprising: a component data storage step of linking in advance and storing lead component shape data for multiple types of lead components and multiple types of holding tools capable of holding the leads of a lead component; a holding tool data storage step of storing holding tool data including moving directions of the multiple holding tools and clamping directions for holding the lead components; a mounting data acquisition step of acquiring mounting data, including the types and loading positions on the board, of each of previously-attached components and the lead components; a mounting order determination step of determining the mounting order of the lead components on the board based on the shape data and the mounting data of the lead components; a holding tool extraction step of extracting a holding tool, for each lead component, capable of mounting components, according to the mounting order determined by the mounting order determination step, without interfering with previously-attached components based on the holding tool data; an installation order determination step of determining the installation order of holding tools capable of mounting all the lead components according to the mounting order determined by the installing order determination step based on the holding tool extracted by the holding tool extraction step; and an allocation data creation step of creating the allocation data according to the installation order determined by the installation order determination step.

Advantageous Effects

According to the present disclosure, installing the holding tool in accordance with the allocation data created by the data creation device improves the mounting efficiency of holding a lead of a lead component with a holding tool and mounting the lead on a board.

BRIEF DESCRIPTION OF DRAWINGS

FIG. 11 is a diagram showing an example of a position data table of a mounting lead component.

FIG. 12 is a diagram showing an example of a BOM data table of the mounting lead component.

FIG. 13 is a diagram showing an example of a component data table of the mounting lead component.

FIG. 14 is a diagram showing an example of a tool data table.

FIG. 15 is a diagram showing an example of a position data table of a previously-attached component.

FIG. 16 is a diagram showing an example of a BOM data table of the previously-attached component.

FIG. 21 is a diagram showing an example of an mounting order interference data table.

FIG. 22 is an example of an allocation data table representing the installation order of the holding tool.

DESCRIPTION OF EMBODIMENTS

Hereinafter, a data creation device and a program according to an embodiment of the present disclosure will be described in detail with reference to the drawings. First, a schematic configuration of component mounting machine 10 for mounting lead components on a board will be described with reference to FIGS. 1 to 6.

(A) General Configuration of the Component Mounting Machine

Figure 1:
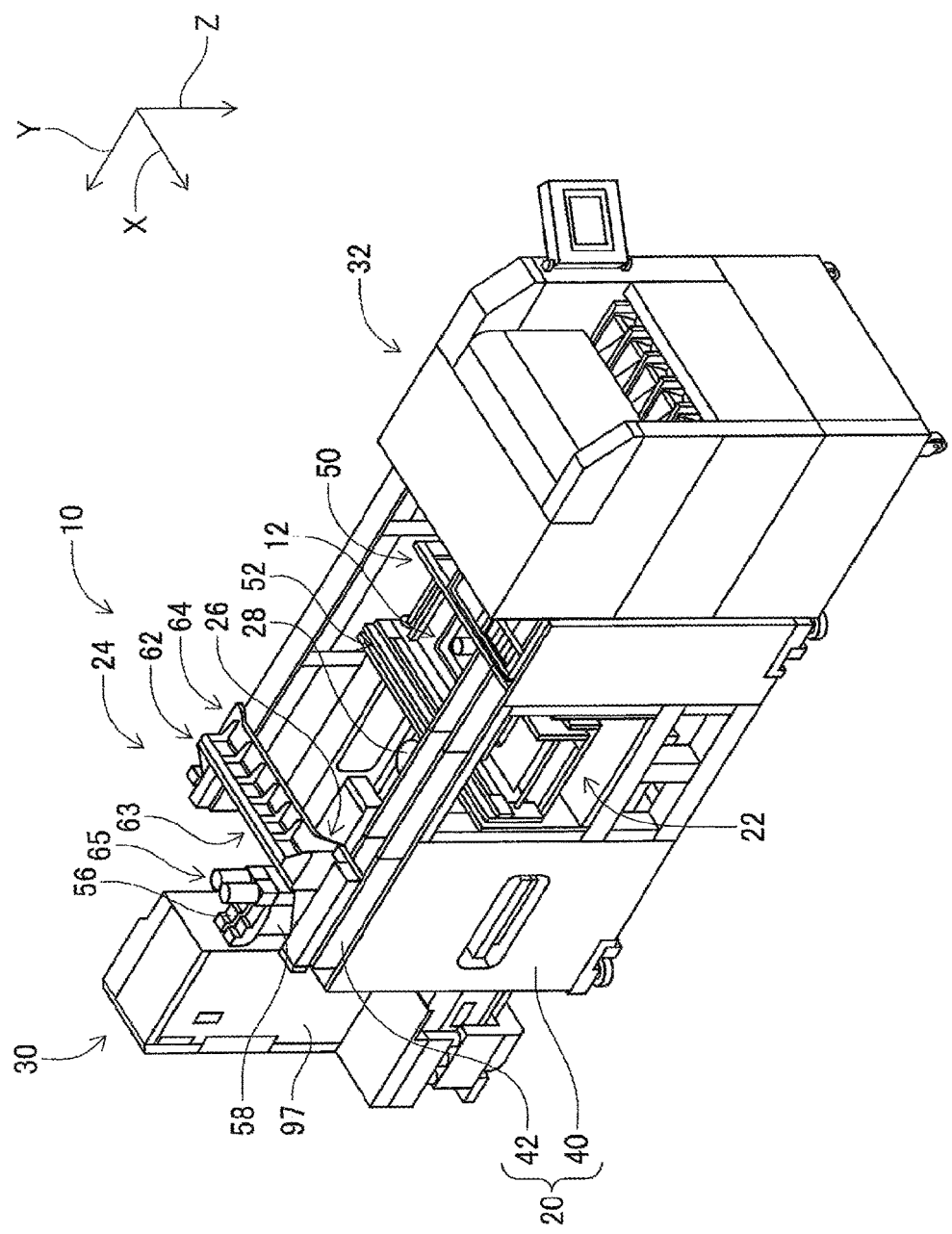
FIG. 1 is a perspective view showing a component mounting machine.

FIG. 1 shows component mounting machine 10. Component mounting machine 10 is a device for performing a mounting operation of a component on circuit substrate 12. Component mounting machine 10 includes device main body 20, substrate conveyance and holding device 22, component mounting device 24, mark camera 26, parts camera 28, component supply device 30, bulk component supply device 32, and control device 36 (see FIG. 6). Circuit substrate 12 is a three-dimensional structure substrate such as a circuit board, and the circuit board could be a printed wiring board, a printed circuit board, or the like.

Device main body 20 includes frame section 40 and beam section 42 mounted on frame section 40. Substrate conveyance and holding device 22 is disposed at the center of frame section 40 in the front-rear direction and includes conveyance device 50 and clamping device 52. Conveyance device 50 is a device for conveying circuit substrate 12, and clamping device 52 is a device for holding circuit substrate 12. Thus, substrate conveyance and holding device 22 conveys circuit substrate 12 and fixedly holds circuit substrate 12 at a predetermined position. In the following description, the conveyance direction of circuit substrate 12 is referred to as the X-direction, the horizontal direction perpendicular to the X-direction is referred to as the Y direction, and the vertical direction is referred to as the Z-direction. That is, the width direction of component mounting machine 10 is the X-direction, and the front-rear direction is the Y-direction.

Component mounting device 24 is disposed on beam section 42 and includes two work heads 56, 58 and work head moving device 62. Work head moving device 62 is composed of X-direction moving device 63, Y-direction moving device 64, and Z-direction moving device 65. X-direction moving device 63 and Y-direction moving device 64 have electromagnetic motors (see FIG. 6) 66, 68, respectively, and two work heads 56, 58 are integrally moved to any position on frame section 40 by the operation of electromagnetic motors 66, 68.

Z-direction moving device 65 includes electromagnetic motors (see FIG. 6) 70A, 70B, and sliders 74, 76 are individually moved in the up-down direction by the operation of electromagnetic motors 70A, 70B. Work heads 56, 58 are detachably mounted on sliders 74,76. As a result, work heads 56, 58 are individually moved in the up-down direction by Z-direction moving device 65.

Each of the electromagnetic motors 66, 68, 70, 72 has an encoder (not shown), and the rotation angle of each of the electromagnetic motors 66, 68, 70, 72 is detected by the respective encoder. The operation of each electromagnetic motor 66, 68, 70, 72 is then controlled so that the rotation angle of each electromagnetic motor 66, 68, 70, 72 is at a target rotation angle, whereby work heads 56, 58 move to respective target positions. Each electromagnetic motor 66, 68, 70, 72 has a structure capable of limiting the amount of electric power supplied at the time of operation, and it is possible to limit the driving force, that is, the driving torque, by limiting the amount of electric power supplied.

Figure 2:
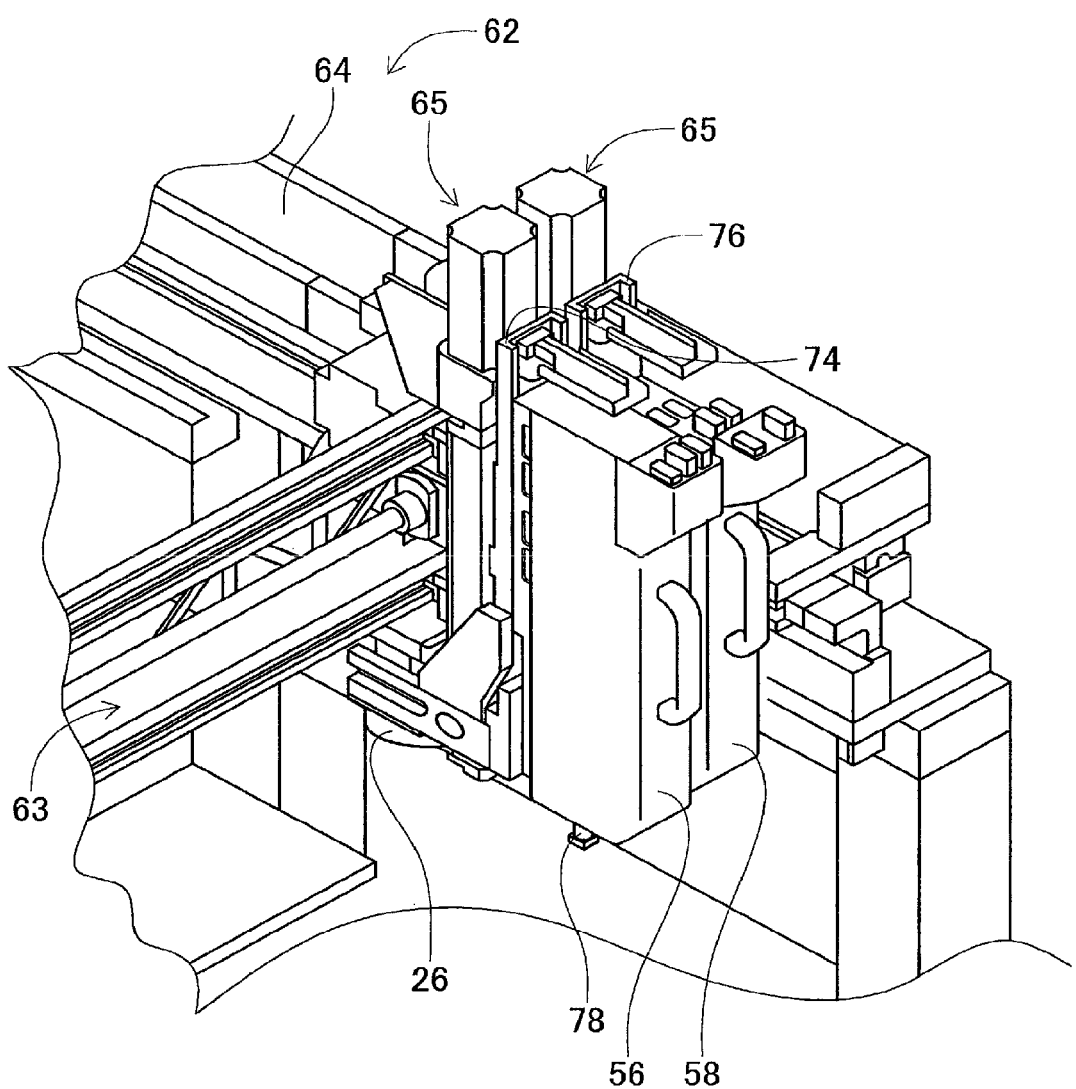
FIG. 2 is a perspective view showing a component mounting device of the component mounting machine.
Figure 3:
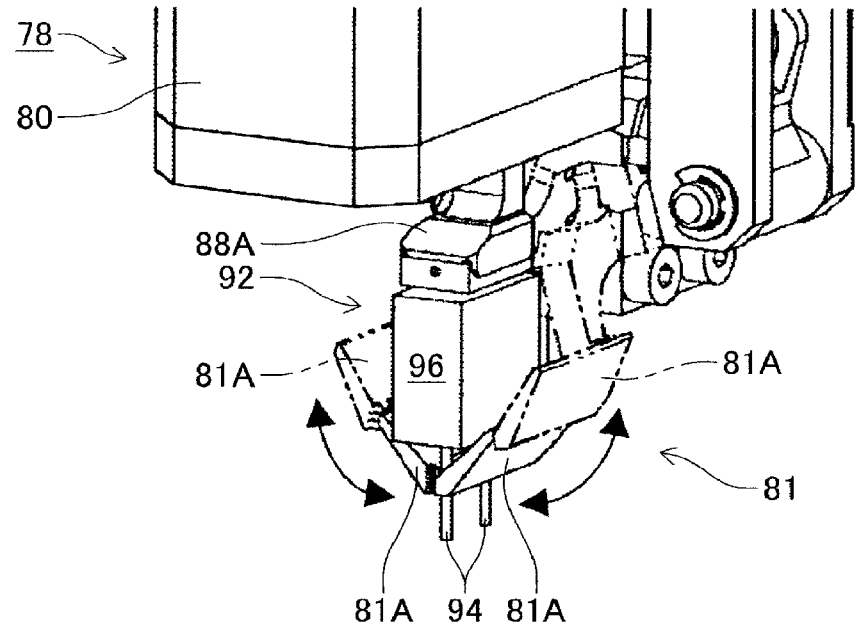
FIG. 3 is a perspective view showing an example of a component holding device.
Figure 4:
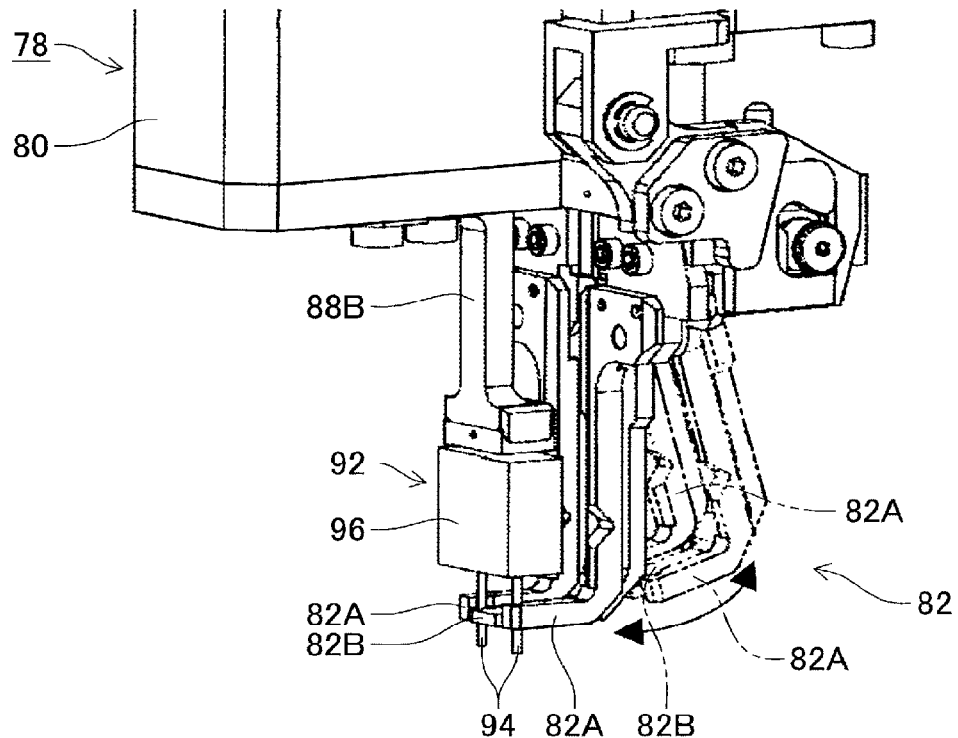
FIG. 4 is a perspective view showing an example of the component holding device.
Figure 5:
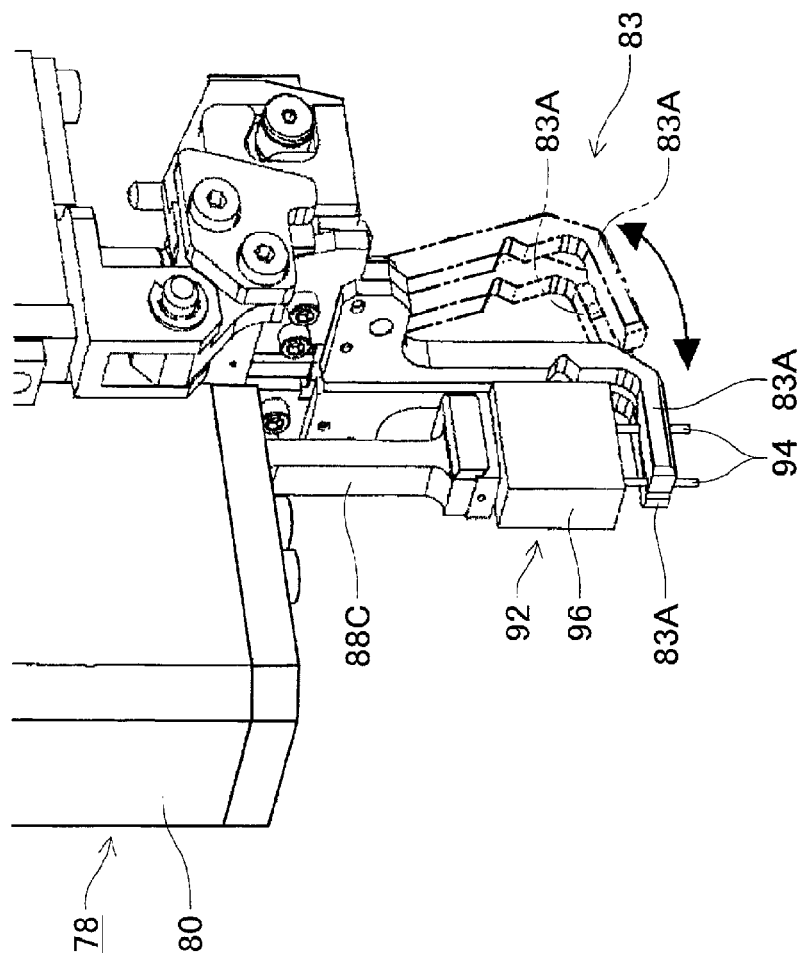
FIG. 5 is a perspective view showing the example of the component holding device.

As shown in FIG. 2, component holding tool 78 is attached to the lower end face of each of work heads 56, 58. Component holding tool 78 holds lead wires of lead components, and as shown in FIGS. 3 to 5, includes main body section 80, three types of holders 81, 82, 83, opening/closing device 86 (see FIG. 6), and pushers 88A, 88B, 88C. FIG. 3 is a perspective view of holding tool 81 and pusher 88A, and is a perspective view of a state in which radial lead component (hereinafter referred to as "lead component") 92 is held and a normal state. FIG. 4 is a perspective view of holding tool 82 and pusher 88B, and is a perspective view of a state in which lead component 92 is held and a normal state. FIG. 5 is a perspective view of holding tool 83 and pusher 88C, and is a perspective view of a state in which lead component 92 is held and a normal state.

Each of the three types of holding tools 81, 82, 83 are paired with their respective pushers 88A, 88B, 88C and are integrally attached, in a detachable manner, to the lower end face of main body section 80 and rotatably attached around a vertical axis. Also, each of the three types of holding tools 81, 82, 83 and their respective pushers 88A, 88B, 88C are paired and arranged on tool station 85 (see FIG. 6). The three types of holding tools 81, 82, 83 and their respective pushers 88A, 88B, 88C are configured to be automatically exchanged on tool station 85.

Each of work heads 56, 58 has electromagnetic motors (see FIG. 6) 72A, 72B; and holding tool 81 and pusher 88A, holding tool 82 and pusher 88B, or holding tool 83 and pusher 88C, which are rotatably attached to the lower end face of each main body section 80, are integrally rotated around the vertical axis by operation of electromagnetic motors 72A, 72B. Each of electromagnetic motors 72A, 72B has an encoder (not shown), and the rotation angle of each of electromagnetic motors 72A, 72B is detected by the respective encoder.

The operation of each of electromagnetic motors 72A, 72B is controlled so that the rotation angle of each of electromagnetic motors 72A, 72B attains a target rotation angle, whereby holding tool 81 and pusher 88A, holding tool 82 and pusher 88B, or holding tool 83 and pusher 88C, which are rotatably attached to the lower end face of each main body section 80, are rotated around the vertical axis from the origin position to the target rotation angle. In other words, the leads of lead component 92 held by each of holding tools 81, 82, 83 can be rotated around the vertical axis so as to be aligned in the Y-direction or aligned along the X-direction.

Here, the schematic configuration of each of holding tools 81, 82, 83 will be described with reference to FIGS. 3 to 5. First, as shown in FIG. 3, holding tool 81 is constituted by a pair of flat plate-shaped claw sections 81A arranged in a shape that is inverted in a front view. The pair of flat plate-shaped claw sections 81A are held by main body section 80 so as to be swingable in an obliquely upward direction when viewed from the front, and the lower end edges of claw sections 81A approach each other or separate from each other by the operation of opening/closing device 86. A recess (not shown) having a size corresponding to the wire diameter of each lead 94 of lead component 92 to be held is formed inside the lower end edge of each claw section 81A. The pair of claw sections 81A swings between the state shown by the solid line in FIG. 3 (hereinafter, sometimes referred to as the "gripped state") and a state shown by the two-dot chain line in FIG. 3 (hereinafter, sometimes referred to as a "released state").

By the pair of claw portions 81A swinging obliquely downward toward the gripped state, the lower end edges of the pair of claw sections 81A then clamp the respective pair of leads 94 of lead component 92 from both side surfaces with the recessed portion of claw sections 81A. As a result, as shown in FIG. 3, lead component 92 is held by holding tool 81 at the base end of the pair of leads 94, that is, at the end of leads 94 closer to component body 96. When holding tool 81 and pusher 88A are positioned at the origin position, the pair of leads 94 of lead component 92 are gripped while being aligned with the Y-direction. Thus, the reference direction of lead component 92 is the Y-direction.

Pusher 88A is held by main body section 80 so as to be movable in the up-down direction and moves up and down by the operation of air cylinder 89. When pusher 88A descends, pusher 88A contacts component body 96 of lead component 92 held by holding tool 81 and presses lead component 92 downward. When lead component 92 is pressed downward by pusher 88A, each claw section of the pair of claw sections 81A of holding tool 81 swings obliquely upward, thereby releasing leads 94. That is, holding tool 81 is swung from the gripped state toward the released state. Therefore, if there is no gap equal to or larger than a predetermined distance (e.g., a distance of about 5 mm) between the pair of claw sections 81A and adjacent components in the swinging direction of the pair of claw sections 81A, there is a possibility of contact with adjacent components.

Next, as shown in FIG. 4, holding tool 82 is composed of a pair of claw sections 82A, having an L-shape in a side view, and auxiliary plate 82B. The pair of claw sections 82A are held by main body section 80 so as to be swingable in the left-right direction when viewed from the front, and as the pair of claw sections 82A are swung by the operation of opening/closing device 86, the distal ends of claw sections 82A approach each other or separate from each other. A recess (not shown) having a size corresponding to the wire diameter of lead 94 of lead component 92, which is a holding target, is formed inside the pair of claw sections 82A.

Auxiliary plate 82B is positioned between the pair of claw sections 82A and swings together with the pair of claw sections 82A in a direction orthogonal to the closing/releasing direction of the pair of claw sections 82A. That is, the pair of claw sections 82A and auxiliary plate 82B swing between the state shown by the solid line in FIG. 4 (hereinafter, sometimes referred to as the "gripped state") and the state shown by the two-dot chain line in FIG. 4 (hereinafter, sometimes referred to as a "released state").

The pair of claw sections 82A and auxiliary plate 82B swing toward the gripped state so that auxiliary plate 82B enters between the pair of leads 94 of lead component 92 and the pair of claw sections 82A approach auxiliary plate 82B. At this time, each lead of the pair of leads 94 of lead component 92 is clamped from both sides by a recess formed by claw section 82A and auxiliary plate 82B. As a result, as shown in FIG. 4, lead component 92 is held by holding tool 82 at the proximal end of lead 94, that is, at the end of lead 94 closer to component body 96. When holding tool 82 and pusher 88B are positioned at the origin position, the pair of leads 94 of lead component 92 are gripped while being aligned along the X-direction. Therefore, the reference direction of lead component 92 is the X-direction.

Pusher 88B is held by main body section 80 so as to be movable in the up-down direction and moves up and down by the operation of air cylinder 89. When pusher 88B descends, pusher 88B contacts component body 96 of lead component 92 held by holding tool 82 and presses lead component 92 downward. When lead component 92 is pressed downward by pusher 88B, each claw section of the pair of claw sections 82A of holding tool 82 swings in the direction of separation, thereby releasing leads 94. That is, holding tool 82 swings from the gripped state toward the released state. Therefore, if there is no gap equal to or larger than a predetermined distance (e.g., a distance of about 10 mm) with adjacent components when the pair of claw sections 82A and auxiliary plate 82B swing toward the released state, there is a possibility of contact with the adjacent components.

Next, as shown in FIG. 5, holding tool 83 is configured by a pair of claw sections 83A having an L-shape in a side view. The pair of claw sections 83A are held by main body section 80 so as to be swingable in the left-right direction when viewed from the front, and as the pair of claw sections 83A are swung by the operation of opening/closing device 86, the lower end edges of claw sections 83A approach each other or separate from each other. A recess (not shown) having a size corresponding to the wire diameter of lead 94 of lead component 92, which is a holding target, is formed inside the pair of claw sections 83A.

Further, the pair of claw sections 83A swings, in a direction orthogonal to the closing/releasing direction of the pair of claw sections 83A, at the same time as the distal ends of the pair of claw sections 83A approach each other or separate from each other. That is, the pair of claw sections 83A swings between the state shown by the solid line in FIG. 5 (hereinafter, sometimes referred to as the "gripped state") and the state shown by the two-dot chain line in FIG. 5 (hereinafter, sometimes referred to as a "released state").

When the pair of claw sections 83A swings toward the gripped state, each lead of the pair of leads 94 of lead component 92 is clamped from both sides by the recessed portion of claw section 83A. As a result, as shown in FIG. 5, lead component 92 is held by holding tool 83 at the base end of the pair of leads 94, that is, at the end of leads 94 closer to component body 96. When holding tool 83 and pusher 88C are disposed at the origin position, the pair of leads 94 of lead component 92 are gripped while being aligned with the Y-direction. Thus, the reference direction of lead component 92 is the Y-direction.

Pusher 88C is held by main body section 80 so as to be movable in the up-down direction and moves up and down by the operation of air cylinder 89. When pusher 88C descends, pusher 88C contacts component body 96 of lead component 92 held by holding tool 83 and presses lead component 92 downward. When lead component 92 is pressed downward by pusher 88C, each claw section of the pair of claw sections 83A of holding tool 83 swings in the direction of separation, thereby releasing leads 94. That is, holding tool 83 swings from the gripped state toward the released state. Therefore, if there is no gap equal to or larger than a predetermined distance (e.g., a distance of about 10 mm) between the adjacent components adjacent to each other in the direction in which the pair of claws 83A swing toward the released state, there is a possibility of contact with the adjacent components.

Further, mark camera 26 is attached to slider 74 while being directed downward as shown in FIG. 2 and is caused to move in the X-direction, Y-direction, and Z-direction together with work head 56. As a result, mark camera 26 captures an image of any position on frame section 40. Further, as shown in FIG. 1, parts camera 28 is disposed between substrate conveyance and holding device 22 and component supply device 30 on frame section 40, and faces upward. As a result, parts camera 28 images components held by component holding tool 78 of work heads 56, 58.

Component supply device 30 is disposed at one end of frame section 40 in the front-rear direction. Component supply device includes tray-type component supply device 97 and feeder-type component supply device 98 (see FIG. 6). Tray-type component supply device 97 is a device for supplying components placed on a tray. Feeder-type component supply device 98 is a device for supplying components with a tape feeder or a stick feeder (not shown).

Bulk component supply device 32 is disposed at the other end of frame section 40 in the front-rear direction. Bulk component supply device 32 is a device for aligning multiple components scattered in a loose state and supplying the components in an aligned state. That is, bulk component supply device 32 is a device that aligns multiple components, being in random orientations, into a predetermined orientation and supplies the components in the predetermined orientation.

Examples of components supplied by component supply device 30 and bulk component supply device 32 include electronic circuit components, solar cell components, power module components, and the like. Electronic circuit components include radial lead components having a lead, axial lead components, components without leads, and the like.

Figure 6:
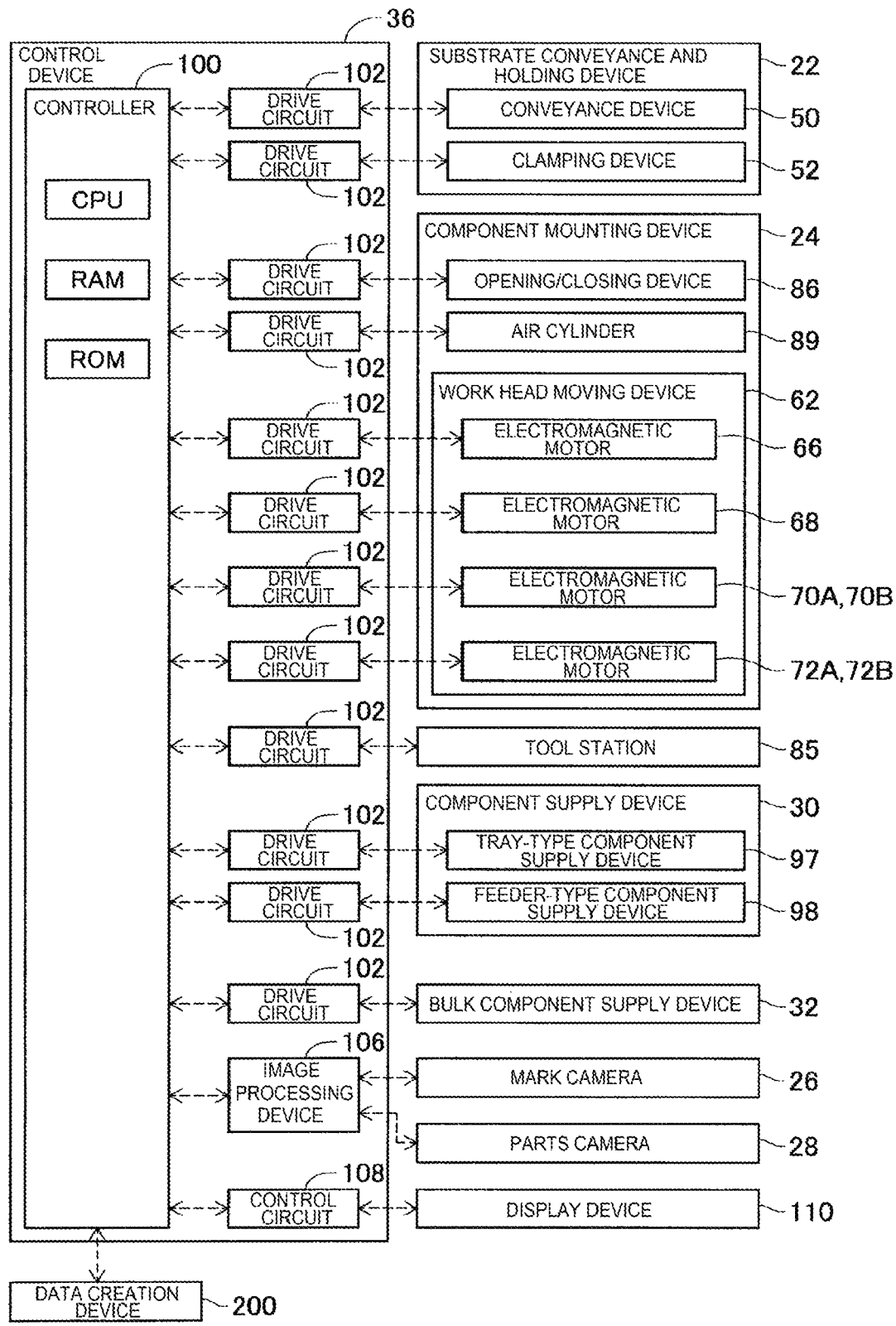
FIG. 6 is a block diagram showing a control device.

As shown in FIG. 6, control device 36 includes controller 100, multiple drive circuits 102, image processing device 106, and control circuit 108. Multiple drive circuits 102 are connected to conveyance device 50, clamping device 52, electromagnetic motors 66, 68, 70A, 70B, 72A, 72B, tool station 85, opening/closing device 86, air cylinder 89, tray-type component supply device 97, feeder-type component supply device 98, and bulk component supply device 32. Controller 100 includes a CPU, ROM, RAM, and the like, mainly comprises a computer, and is connected to multiple drive circuits 102.

As a result, the operations of substrate conveyance and holding device 22, component mounting device 24, and the like are controlled by controller 100. Controller 100 is also connected to image processing device 106. Image processing device 106 processes image data obtained by mark camera 26 and parts camera 28, and controller 100 acquires various types of information from the image data.

Further, controller 100 is connected to display device 110 via control circuit 108, and an arbitrary image is displayed on display device 110 in response to an instruction from controller 100. Further, controller 100 is connected to data creation device (see FIG. 7) 200, which will be described later, and is configured to transmit and receive various data such as allocation data table (see FIG. 22) 311 indicating the installation order for installing holding tools 81, 82, 83 and the installation order of radial lead components (hereinafter referred to as "lead components").

(B) Schematic Configuration of Data Creation Device

Figure 7:
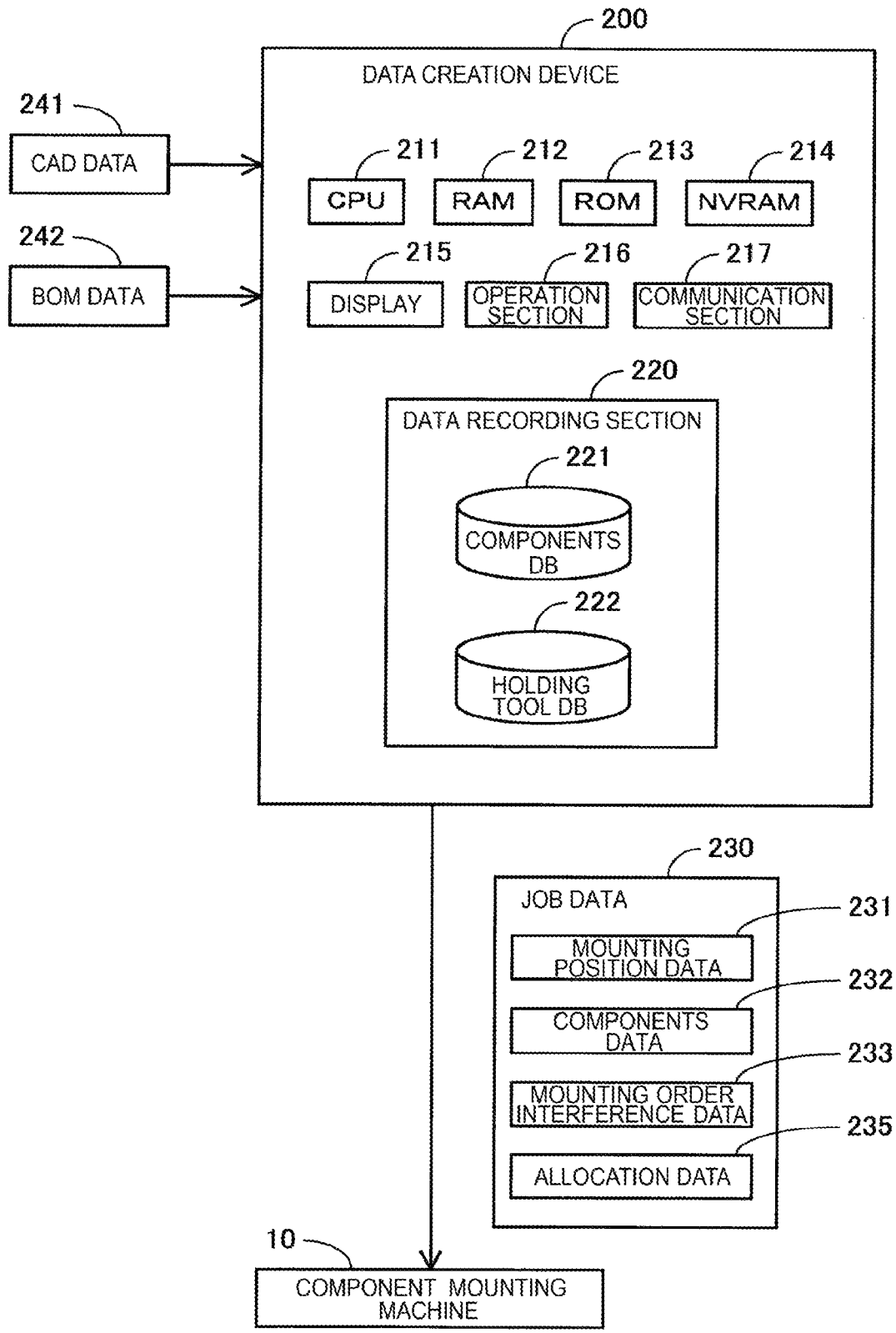
FIG. 7 is a block diagram showing a schematic configuration of a data creation device.

FIG. 7 shows data creation device 200. Data creation device 200 is composed of a personal computer or the like, and includes CPU 211, RAM 212, ROM 213, NVRAM 214, display 215, operation section 216, communication section 217, data recording section 220, and the like. CPU 211 controls connected display 215 and the like by executing various programs stored in ROM 213.

RAM 212 is used as a main memory for CPU 211 for executing various processes. ROM 213 stores a program for an allocation data creation process (see FIGS. 8 to 10), a control program, various data, and the like to be described later. Various types of information are recorded in NVRAM 214. Display 215 is, for example, a liquid crystal display, and displays, for example, various setting screens, buttons (not shown) for starting the allocation data creation process to be described later, operation states of component mounting machine 10, and the like in accordance with CPU 211 instructions.

Operation section 216 includes a keyboard and a mouse (not shown), and receives operations from an operator. Communication section 217 transmits and receives data to and from a server (not shown) via a network. Data recording section 220 includes a hard disk (not shown), parts database (parts DB) 221 stored in the hard disk, holding tool database (holding tool DB) 222, and a driver (not shown) for reading a predetermined program or the like and writing predetermined data to the hard disk.

Data creation device 200 creates job data 230, which is NC data, based on CAD data 241, BOM data 242, parts data (see FIGS. 13 and 17) of parts DB 221 stored in data recording section 220, and tool data (see FIG. 14) of holder DB 222. Created job data 230 is provided to control device 36 that controls component mounting machine 10. Job data 230 includes mounting position data 231, parts data 232, mounting order interference data 233, allocation data 235, and the like.

CAD data 241 includes information such as the shape and position of an electronic component, such as a lead component in circuit substrate 12, for example, wiring such as printed wiring, a hole, and the like. Data creation device 200 extracts position data and the like of a mounted radial lead component (hereinafter referred to as a "mounted lead component") and the like in circuit substrate 12 from CAD data 241, creates mounting lead component position data table 301 (see FIG. 11) and previously-attached component position data table 306 (see FIG. 15), which will be described later, and stores them as mounting position data 231.

BOM data 242 is a table in which a "reference" and a "part number" corresponding to each mounting lead component and the like in circuit substrate 12 are linked together. The "reference" is an identifier uniquely assigned to each mounted electronic component and the like in circuit substrate 12 and is a name uniquely assigned to the corresponding electronic component in a circuit diagram. The "part number" is an identifier for specifying an electronic component mounted on circuit substrate 12 and is information including, for example, the manufacturer and product number of the electronic component.

Data creation device 200 extracts the "reference" and "part number" for each mounting lead component and the like in circuit substrate 12 from BOM data 242, creates mounting lead component BOM data table 302 (see FIG. 12) and previously-attached component BOM data table 307 (see FIG. 16), which will be described later, and stores them as parts data 232.

Parts DB 221 is composed of various kinds of data required for creating mounting lead component parts data table 303 (see FIG. 13) and previously-attached component parts data table 308 (see FIG. 17), and is composed of data such as "part number", "part size", "holder", "supply form", and the like. The "part size" is information composed of dimensional data for specifying the shape such as the outer diameter, the height, the length, the width, the lead pitch, and the like of an electronic component such as a lead component specified by the "part number". The "holding tool" is information including identifiers for specifying the optimal holding tool and a holding tool that can be used without difficulty when mounting each electronic component such as a lead component specified by a "part number".

The "supply form" is information about the manner in which an electronic component, such as a lead component specified by a "part number" is to be supplied, that is, whether the component will be supplied by a tray, a stick, an axial tape, a radial tape, or the like. The data of parts DB 221 may be downloaded from an external server (not shown) via communication section 217 and stored. Further, the operator may register the data of parts DB 221 by operating the operating section 216.

Holding tool DB 222 is composed of various types of information required for creating tool data table 305 (see FIG. 14), which will be described later, and is composed of, for example, data such as the "type of holding tool", "movable direction and movable distance", "clamping direction", "corresponding lead pitch", and the like. The "type of holding tool" is information including identifiers for specifying each holding tool that can be mounted on component holding tool 78 of component mounting machine 10. The "movable direction and movable distance" is information including the direction of movement of the holding tool and the distance of movement of the holding tool when the holding tool specified by the "type of holding tool" changes from the gripped state to the released state.

The "clamping direction" is information specifying the gripping direction in which, when the holding tool is at the origin position, a state in which the lead is gripped along the X-direction is "horizontal" and a state in which the lead is gripped along the Y-direction is "vertical". The "corresponding lead pitch" is information specifying the lead pitch of the lead component which can be gripped by the holding tool. The data of holding tool DB 222 may be downloaded from an external server (not shown) via communication section 217 and stored. Further, the operator may register the data of holding tool DB 222 by operating the operating section 216.

(C) Allocation Data Creation Process

Next, the allocation data creation process, executed by CPU 211 of data creation device 200 configured as described above, for automatically creating allocation data table (see FIG. 22) 311 showing the installation order of holding tools 81, 82, 83 and the mounting order of lead components will be described with reference to FIGS. 8 to 22. An operator who wants to execute the allocation data creation process operates data creation device 200 to boot up an application which is installed in advance in data creation device 200 and performs the allocation data creation process. The execution of the allocation data creation process is started by clicking a start button (not shown) of the allocation data creation process displayed on display 215 with a mouse or the like.

Figure 8:
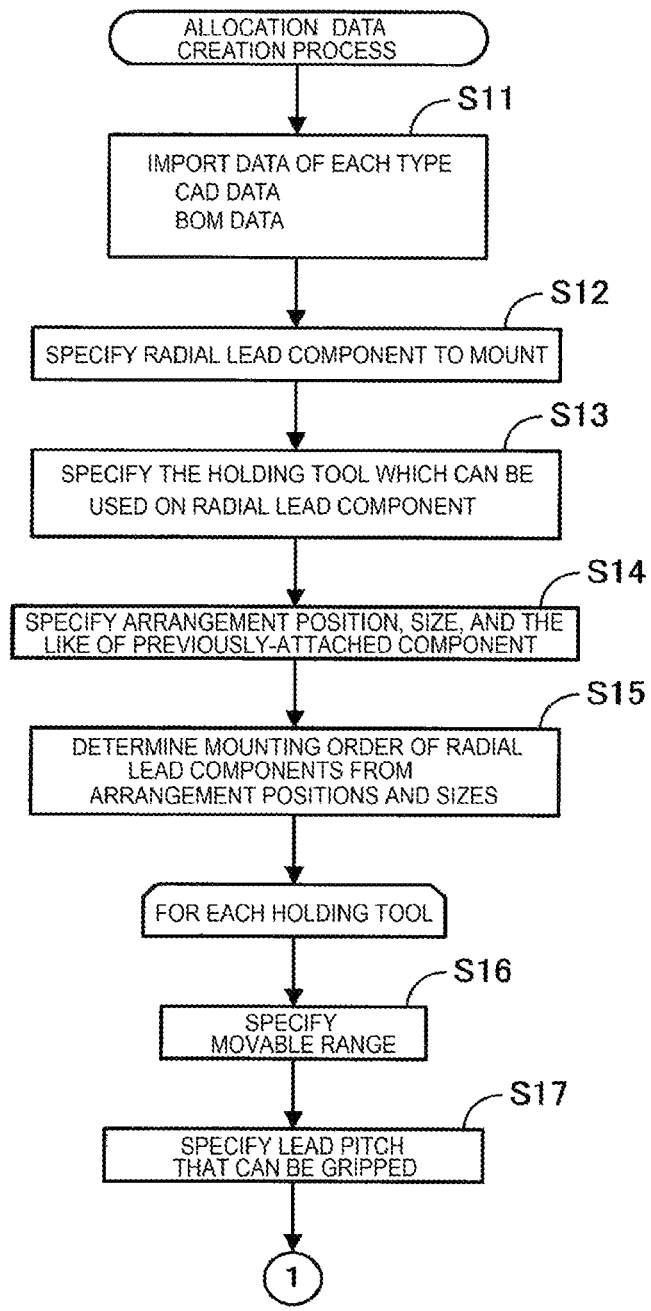
FIG. 8 is a flow chart showing an installation order decision process for determining the installation order of the holding tool.

As shown in FIG. 8, first, in step (hereinafter shortened to "S") 11, CPU 211 of data creation device 200 imports CAD data 241 and BOM data 242. Specifically, CPU 211 converts the received CAD data 241 and BOM data 242 into a format as needed, for example, through communication section 217, and stores them in RAM 212.

In S12, CPU 211 then extracts position data or the like of the mounting lead components (i.e., the radial lead component to be mounted) in circuit substrate 12 from CAD data 241, creates mounting lead component position data table 301, and stores mounting lead component position data table 301 as mounting position data 231. Further, CPU 211 extracts "reference" and "part number" of the mounting lead components in circuit substrate 12 from BOM data 242 to create mounting lead component BOM data table 302 and stores it as parts data 232.

Here, mounting lead component position data table 301 will be described with reference to FIG. 11. As shown in FIG. 11, mounting lead component position data table 301 is a table in which "reference", "reference coordinates (X-coordinate)", "reference coordinates (Y-coordinate)", "arrangement direction", and the like are linked together. The "reference" is an identifier uniquely assigned to each radial lead component (hereinafter referred to as a "lead component") mounted on circuit substrate 12 and is a name uniquely assigned to the corresponding lead component in the circuit diagram. The "reference coordinates" are relative coordinates of a reference position for each electronic component defined in the parts data of parts DB 221 with respect to a reference position on circuit substrate 12.

The "arrangement direction" is an arrangement direction of each electronic component with respect to a reference direction of circuit substrate 12 and is a direction based on the reference direction of an electronic component defined in the parts data of parts DB 221. Here, it is assumed that the reference direction of circuit substrate 12 is such that the long side direction of circuit substrate 12, which is rectangular, is the X-direction and the short side direction is the Y-direction, and the reference direction of the lead component is such that the direction in which the leads are arranged is the X-direction and the direction orthogonal to the X-direction is the Y-direction. In this case, the "arrangement direction" is "horizontal" when the X-direction of the lead component is aligned with the X-direction of the board, and the "arrangement direction" is "vertical" when the Y-direction of the lead component is aligned with the X-direction of the board.

For example, for "reference" C1, that is, the lead component (radial lead component) having the name C1 on the circuit diagram, is arranged at the relative coordinates (X11, Y11) with respect to the reference position of circuit substrate 12 in the "horizontal" direction, that is, the leads are arranged along the X-direction. Circuit substrate 12 is conveyed and fixed such that the long side direction of circuit substrate 12 is arranged along the X-direction of component mounting machine 10, and the short side direction of circuit substrate 12 is arranged along the Y-direction of component mounting machine 10.

Next, mounting lead component BOM data table 302 will be described with reference to FIG. 12. As shown in FIG. 12, mounting lead component BOM data table 302 is a table in which "reference", "part number", and the like are linked together. For example, the "part number" of "reference" C1 to C6, that is, the lead components (i.e., radial lead components) on the circuit diagram named C1 to C6, are all "AA1" and are the same lead component (radial lead component).

As shown in FIG. 8, in S13, CPU 211 extracts the "part number" type from mounting lead component BOM data table 302. CPU 211 then sets each extracted "part number" type as a "part number" in parts DB 221, and reads the "part size" and the "holding tool" information corresponding to each "part number" from parts DB 221. CPU 211 creates mounting lead component parts data table 303 from the "part number" type, extracted from mounting lead component BOM data table 302 and the "part size" and "holding tool" information read from parts DB 221, and stores mounting lead component parts data table 303 as parts data 232.

Here, mounting lead component parts data table 303 will be described with reference to FIG. 13. As shown in FIG. 13, mounting lead component parts data table 303 is a table in which "part number", "part size" of the "radial lead component", identifiers "LC-A", "LC-B", "LC-C" of the "holding tool", and the like are linked together. The identifier "LC-A" is an identifier assigned to holding tool 81. The identifier "LC-B" is an identifier assigned to holding tool 82. The identifier "LC-C" is an identifier assigned to holding tool 83.

Specifically, CPU 211 sequentially stores, in "part number" of the "radial lead component", "AA1" corresponding to each of the references C1 to C6 extracted from the "part numbers" of mounting lead component BOM data table 302, "BB1" corresponding to each of the references D1 to D4, and "CC1" corresponding to the reference E1.

Next, for example, with part number "AA1" being the "part number" from parts DB 221, CPU 211 reads out from parts DB 221, as the "part size" corresponding to part number "AA1", dimensional data of a cylindrical electronic component having "outer diameter: φ10 mm, height: 12.5 mm, lead pitch: 5 mm". CPU 211 then stores the data of "outer diameter: φ10 mm, height: 12.5 mm, lead pitch: 5 mm" in the "part size" corresponding to part number "AA1" of the "radial lead component". In the same manner, CPU 211 reads out information specifying the shapes of the electronic components corresponding to part numbers "BB1" and "CC1" of the "radial lead components" from parts DB 221 and stores the information in "part size".

Further, CPU 211 uses part number "AA1", as a "part number" of parts DB 221, and reads the "holding tool" information corresponding to part number "AA1", that is, information including identifiers for specifying the optimal holding tool and a holding tool that can be used without difficulty when mounting the cylindrical electronic component specified by part number "AA1". CPU 211 then determines whether any of the identifiers "LC-A", "LC-B", and "LC-C" of the "holding tools" is included among the identifiers of holding tools read from parts DB 221.

For each of the identifiers "LC-A", "LC-B", and "LC-C" of the "holding tools", if the identifier is included among the identifiers of the holding tools read from parts DB 221, CPU 211 stores the identifier with a mark "○" indicating that the corresponding holding tool can be used when mounting. On the other hand, for each of the identifiers "LC-A", "LC-B", and "LC-C" of the "holding tools", if the identifier is not included among the identifiers of the holding tools read from parts DB 221, CPU 211 stores the identifier with an "x" mark indicating that the corresponding holding tool cannot be used when mounting.

In the same manner, CPU 211 reads out the identifiers of the holding tools corresponding to the respective part numbers "BB1" and "CC1" of the "radial lead component" from parts DB 221, determines whether they are included in the identifiers "LC-A", "LC-B" and "LC-C" of the "holding tool", and stores the determination results with "○" marks or "x" marks.

Further, as shown in FIG. 8, in S13, CPU 211 extracts, from mounting lead component parts data table 303, an identifier of a "holding tool" marked with an "○" indicating that it can be used in mounting, among identifiers "LC-A", "LC-B", "LC-C", and the like. CPU 211 then sets each of the extracted identifiers as the "type of holding tool" of holding tool DB 222, and reads out information such as "movable direction and movable distance", "clamping direction", "corresponding lead pitch" and the like corresponding to each "type of holding tool" from holding tool DB 222.

CPU 211 then creates tool data table 305 from the identifier of the "holding tool" extracted from mounting lead component parts data table 303 and information such as the "movable direction and movable distance", "clamping direction", "corresponding lead pitch" read out from holding tool DB 222, and stores tool data table 305 as parts data 232.

Here, tool data table 305 will be described with reference to FIG. 14. As shown in FIG. 14, tool data table 305 is a table in which "holding tool", "movable direction and movable distance", "clamping direction", "corresponding lead pitch", and the like are grouped together. For example, the "holding tool" stores the identifiers "LC-A", "LC-B" and "LC-C" marked with "○", indicating that they can be used for mounting, among the identifiers "LC-A", "LC-B", "LC-C" and the like of the "holding tool" of mounting lead component parts data table 303.

Further, for example, "5 mm left-right" is stored in "movable direction and movable distance" for the identifier "LC-A" of the "holding tool", thus storing the fact that when the pair of claw sections 81A of holding tool 81, to which the identifier "LC-A" is attached, moves by about 5 mm in the left-right direction when holding tool 81 changes from the gripped state to the released state. Further, for example, the "vertical" direction is stored for the "clamping direction" corresponding to the identifier "LC-A" of the "holding tool", thus storing the fact that when holding tool 81, to which the identifier "LC-A" is attached, is positioned at the origin position, the leads are gripped while being aligned in the Y-direction. For example, "5 mm to 12 mm" is stored in "corresponding lead pitch" corresponding to the identifier "LC-A" of the "holding tool", thus storing the lead pitch of the lead component that can be gripped by holding tool 81, to which the identifier "LC-A" is attached.

Next, in S14, prior to mounting the radial lead component to be mounted on circuit substrate 12 based on CAD data 241, CPU 211 extracts position data and the like of the electronic component already mounted (hereinafter referred to as the "previously-attached component") and creates position data table 306 (see FIG. 15) of the previously-attached component and stores the data as mounting position data 231. Further, CPU 211 extracts "reference" and "part number" of the previously-attached component in circuit substrate 12 from BOM data 242 to create previously-attached component BOM data table 307 (see FIG. 16) and stores the BOM data as parts data 232.

As shown in FIG. 15, the configuration of position data table 306 of the previously-attached component is the same as the configuration of mounting lead component position data table 301. As shown in FIG. 16, the configuration of previously-attached component BOM data table 307 is the same as the configuration of mounting lead component BOM data table 302.

In S14, CPU 211 extracts the "part number" type from previously-attached component BOM data table 307. CPU 211 then sets each extracted "part number" type as a "part number" of parts DB 221 and reads out "part size" information corresponding to each "part number" from parts DB 221. CPU 211 creates previously-attached component parts data table 308 (see FIG. 17), from the "part number" type extracted from previously-attached component BOM data table 307 and "part size" information read from parts DB 221, and stores previously-attached component parts data table 308 as parts data 232.

Figures 17, 18:
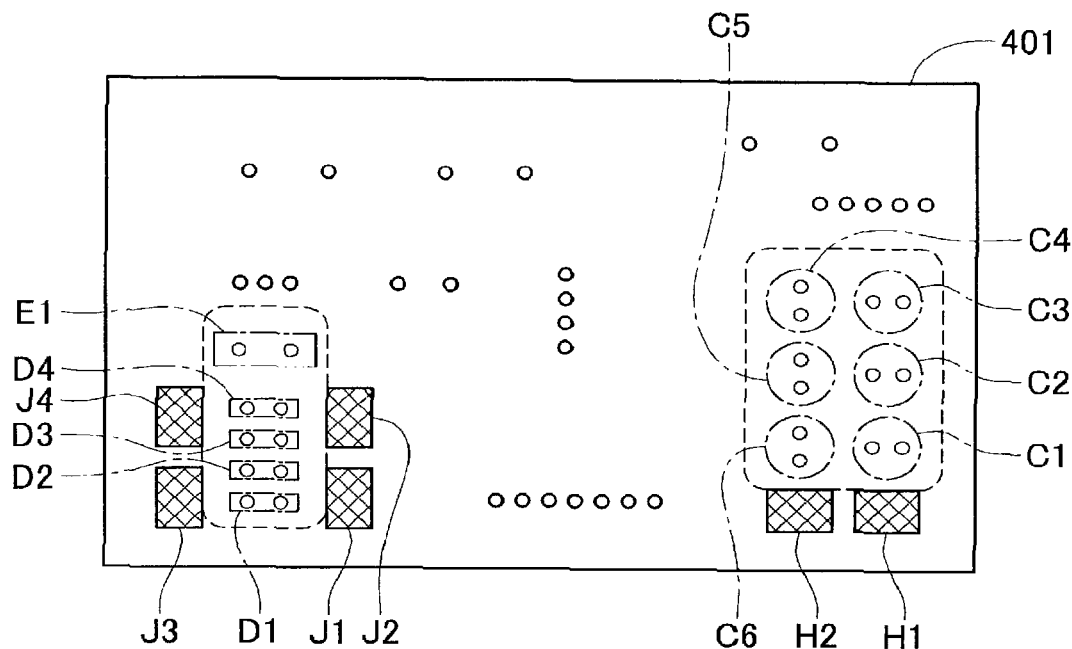
FIG. 17 is a diagram showing an example of a component data table of a previously-attached component.
FIG. 18 is a diagram showing an example of a state in which a previously-attached component is mounted on a board.

Here, previously-attached component parts data table 308 will be described with reference to FIG. 17. As shown in FIG. 17, previously-attached component parts data table 308 is a table in which "part number", "part size", and the like of "previously-attached components" are linked together. Specifically, for example, CPU 211 sequentially stores in "part number" of the "previously-attached component" "AB1", corresponding to each of the references H1 and H2, and "AC1", corresponding to each of the references J1 to J4, "AB1" and "AC1", having been extracted from "part number" of previously-attached component BOM data table 307.

Next, with part number "AB1" being the "part number" from parts DB 221, CPU 211 reads out from parts DB 221, as the "part size" corresponding to part number "AB1", dimensional data of a substantially rectangular parallelepiped shape having "length: 10 mm, width: 7 mm, height: 4 mm". CPU 211 then stores information of "length: 10 mm, width: 7 mm, height: 4 mm" in the "part size" corresponding to part number "AB1" of "previously-attached component". In the same manner, CPU 211 reads out from parts DB 221 information specifying the form of the electronic component corresponding to the part number "AC1" of "previously-attached component" and stores the information in "part size".

Next, as shown in FIG. 8, in S15, CPU 211 first reads mounting lead component BOM data table 302 and mounting lead component parts data table 303 from parts data 232. CPU 211 sorts the "reference" and "part number" data of mounting lead component BOM data table 302, from "part size" data of "part numbers" of mounting lead component parts data table 303 in order from the small and short "part size", and stores the data in parts data 232 again. For example, as shown in FIG. 13, since the "part size" becomes larger and taller for the "part numbers" in the order of "AA1", "BB1", and "CC1", the "references" and "part numbers" are sorted in this order.

CPU 211 then reads out mounting lead component position data table 301 from mounting position data 231, specifies the arrangement states of the respective references C1 to C6, D1 to D4, and E1 on mounting board 401 from the "reference coordinates (X-coordinate)", "reference coordinates (Y-coordinate)", and "arrangement directions", and stores them in RAM 212, as shown in FIG. 18.

Thereafter, CPU 211 sorts "reference" and "part number" data of mounting lead component BOM data table 302 from the arrangement states of respective references C1 to C6, D1 to D4, E1 on mounting board 401 in the order from the smaller "part size" and lower height, and in the order from the outer peripheral vicinity of mounting board 401, again, and sets the mounting order of mounting the lead components (radial lead components) on mounting board 401.

For example, the references C1 to C6, for which the "part number" is "AA1", are determined to have mounting orders of "1" to "6", in this order. The references D1 to D4, for which the "part number" is "BB1", are determined to have mounting orders of "7" to "10", in this order. Reference E1, for which the "part number" is "CC1", is determined to have mounting order "11". CPU 211 then stores the sorted "reference" and "part number" data in association with the "mounting order" of mounting order interference data table 309 (see FIG. 21) to be described later, and stores the information in mounting order interference data 233.

Here, mounting order interference data table 309 will be described with reference to FIG. 21. As shown in FIG. 21, mounting order interference data table 309 is a table in which "mounting order", "reference", "part number", and "holding tool" identifiers "LC-A", "LC-B", "LC-C" and the like are grouped together as a set. The mounting order of the mounting lead components on mounting board 401 is stored in "mounting order". As described above, the reference and the part number of the mounting lead components sorted in the mounting order are stored in "reference" and "part number", respectively. "Holding tool" stores the identifiers of holding tools 81 to that grip the mounting lead component attachable to component holding tool 78.

Further, CPU 211 executes the processes of S16 to S21 described later for each of the identifiers "LC-A", "LC-B", "LC-C" of "holding tool", and stores, in the mounting order of lead components (radial lead components), whether it is possible that a holding tool will interfere with an electronic component which has been mounted. Specifically, when there is a possibility that a holding tool will interfere with an electronic component which has already been mounted, CPU 211 stores an "x" mark indicating that the holding tool may interfere at the time of mounting. On the other hand, when the holding tool does not interfere with the electronic component which has been mounted, CPU 211 stores a mark "o" indicating that there is no interference at the time of mounting.

Subsequently, as shown in FIG. 8, CPU 211 proceeds to the process of S16. Here, the processes of S16 to S21 are executed for each of holding tools 81 to 83 corresponding to the respective identifiers in the order of "holding tool" identifiers "LC-A", "LC-B", "LCC" of mounting order interference data table 309, which will become processing targets. The processes of S18 to S21 are executed for each "reference" corresponding to the "mounting order" of mounting order interference data table 309. Thereafter, CPU 211 proceeds to the process of S22.

In S16, CPU 211 sets the identifier of "holding tool", which will become a processing target, as the "holding tool"

of tool data table 305 shown in FIG. 14, reads out the data of "movable directions and movable distances" corresponding to the "holding tool", and stores the data in RAM 212 as the movable range of the pair of claw sections of the holding tool. In S17, CPU 211 then sets the identifier of "holding tool", which will become a processing target, as "holding tool" of tool data table 305 shown in FIG. 14, reads the data of the "corresponding lead pitch" corresponding to this "holding tool", and stores the data in RAM 212 as a lead pitch that can be gripped by the holding tool.

Figure 9:
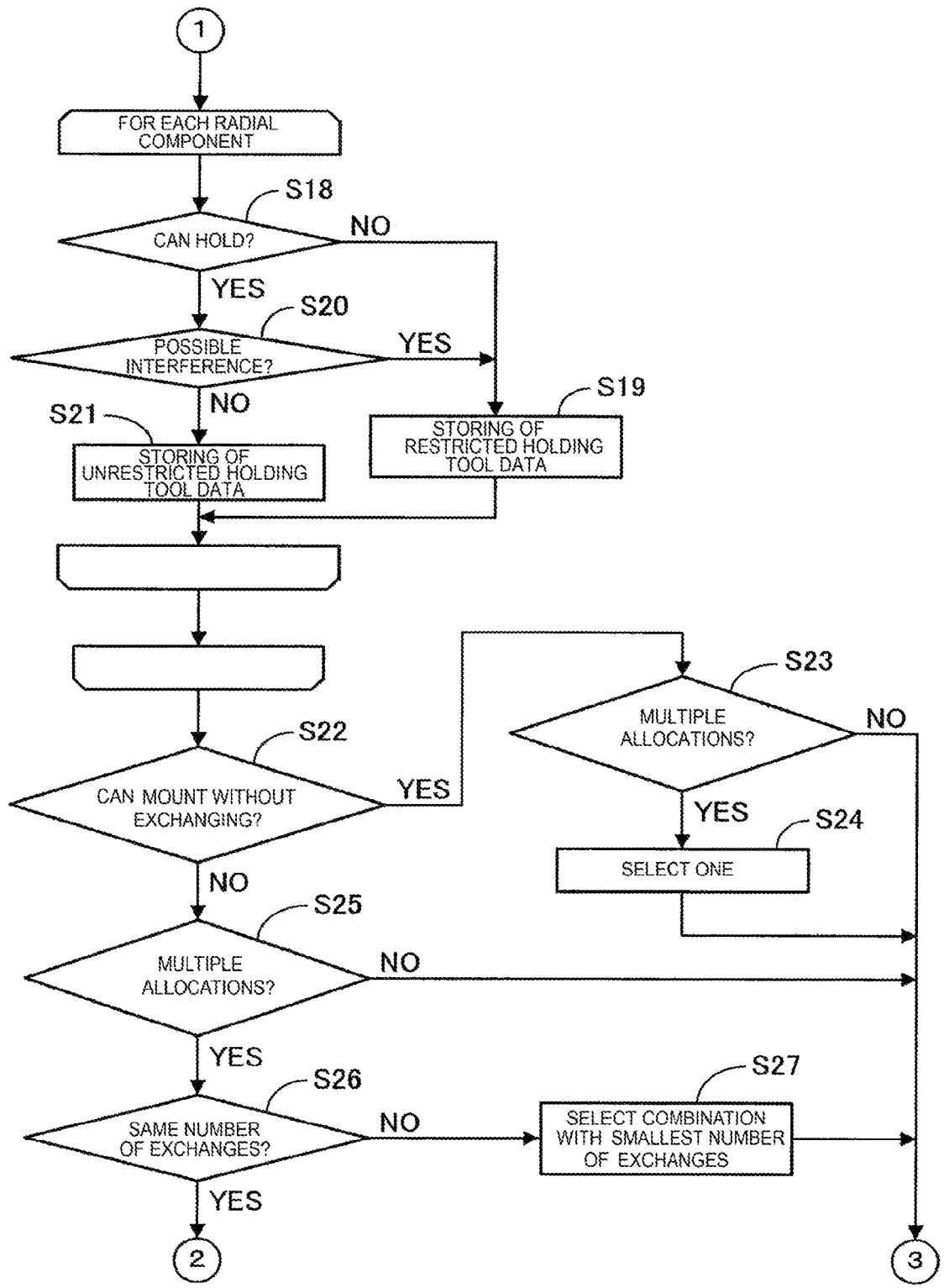
FIG. 9 is a flow chart showing an installation order decision process for determining the installation order of the holding tool.

Next, as shown in FIG. 9, in S18, CPU 211 sets "part number" corresponding to "reference", which will become a processing target, as the "part number" of mounting lead component parts data table 303 shown in FIG. 13 and determines whether the identifier of the holding tool corresponding to the "part number" stores the "o" mark indicating that the identifier can be used at the time of mounting, that is, whether the identifier can be held by the holding tool. If the identifier of the holding tool corresponding to "part number" stores an "x" mark indicating that the identifier cannot be used in mounting (S18: NO), CPU 211 proceeds to the process of S19.

In S19, CPU 211 stores the mark "x" indicating that the holding tool cannot be held, that is, that the use of the holding tool is restricted, in a field among the "holding tool" identifiers, which is a processing target, of mounting order interference data table 309, in an "mounting order" field of the identifier. After that, CPU 211 returns to the process of S18, changes to the "reference" of the subsequent "mounting order", which will become a processing target, and then executes the process of S18 and subsequent steps again.

For example, when the identifier of the "holding tool", which is a processing target, is "LC-B", that is, when the identifier of the "holding tool" is holding tool 82, and the "part number" corresponding to the "reference", which is a processing target, is "CC1" in the "mounting order" of mounting order interference data table 309 is "11", CPU 211 reads out the "X" mark indicating that the identifier cannot be used for mounting from mounting lead component parts data table 303 shown in FIG. 13 (S18: NO). In S19, CPU 211 then stores the mark "x" indicating that the holding tool 82 cannot be held, that is, that the use of holding tool 82 is limited, in the 11th field among the fields with mounting order "1" to "11" of mounting order interference data table 309 in which the identifier "holding tool" is "LC-B" (see FIG. 21).

On the other hand, in S18, when the mark "o" indicating that it is usable in mounting is stored for the identifier of the holding tool corresponding to the "part number" of mounting lead component parts data table 303 shown in FIG. 13 (S18: YES), CPU 211 proceeds to the process of S20.

In S18, CPU 211 may set the "part number" corresponding to the "reference", which will become a processing target, as the "part number" of mounting lead component parts data table 303 shown in FIG. 13, read the data of the "lead pitch" of the "part size" corresponding to the "part number", and determine whether it is within the range of the lead pitch that can be held by the holding tool stored in RAM 212 in S17. When it is determined that the data of the "lead pitch" is not within the range of the lead pitch that can be gripped by the holding tool (S18: NO), the process may proceed to S19. On the other hand, when it is determined that the data of the "lead pitch" is within the range of the lead pitch that can be gripped by the holding tool (S18: YES), the process may proceed to S20.

In S20, CPU 211 reads out position data table 306 of the first component from mounting position data 231, specifies the arrangement states of the references H1, H2, and J1 to J4 on mounting board 401 from the "reference coordinates (X-coordinate)," "reference coordinates (Y-coordinate)," and "arrangement directions," and stores them in the RAM 212, as shown in FIG. 18. CPU 211 then specifies the arrangement state of the electronic components to be mounted on the periphery of the "reference", which will become a processing target, based on the arrangement state of each of the references C1 to C6, D1 to D4, and E1 stored in RAM 212 in S15 above on mounting board 401 and the arrangement state of each of the references H1, H2, and J1 to J4 on mounting board 401.

For example, as shown in FIG. 18, when the "reference", which will become a processing target, is "C1", CPU 211 specifies that reference H1 of the previously-attached component is mounted first on the Y-direction side (i.e., the lower direction in FIG. 18) of reference C1. When the "reference", which will become a processing target, is "C2", CPU 211 specifies that reference C1 of the mounting lead components is mounted first on Y-direction side (i.e., the lower direction in FIG. 18) of reference C2.

CPU 211 then reads out from RAM 212 the movable range of the pair of claw sections of the "holding tool", which will become a processing target, which is stored in RAM 212 in S16. Subsequently, in order to mount the "reference", which will become a processing target, on mounting board 401, CPU 211 determines whether the electronic component previously mounted around the "reference" is within the movable range of the pair of claw sections when the pair of claw sections of the holding tool is changed from the gripped state to the released state. That is, CPU 211 determines whether a pair of claw sections of the holding tool holding the "reference", which will become a processing target, interferes with a previously-attached electronic component when the claw member switches to the released state from the gripped state.

When it is determined that the pair of claw sections of the holding tool holding the "reference", which will become a processing target, interferes with the previously-attached electronic component when the pair of claws changes from the gripped state to the released state (S20: YES), CPU 211 shifts to the process of S19. In S19, CPU 211 stores the mark "X" indicating that the pair of claw sections of the holding tool interferes with an electronic component mounted previously, that is, that the use of the holding tool is restricted, in the column of identifiers of the "holding tool", which is a processing target, of mounting order interference data table 309, in the "mounting order" field of the identifier. After that, CPU 211 returns to the process of S18, changes to the "reference" of the subsequent "mounting order", which will become a processing target, and then executes the process of S18 and subsequent steps again.

For example, as shown in FIG. 18, the previously-attached component of reference H1 and the mounting lead component of reference C1 for which the mounting order in mounting order interference data table 309 is "1" are close to each other in the Y-direction (up-down direction in FIG. 18). Therefore, when the "holding tool" identifier, which is a processing target, is "LC-A", that is, in the case of holding tool 81, CPU 211 determines that since the pair of claw sections 81A which hold reference C1, which is a processing target, swings in the left-right obliquely upward direction when changing from the gripped state to the released state, the pair of claw sections 81A interferes with the previously-attached component, reference H1, (S20: YES).

Then, as shown in FIG. 21, when the pair of claw sections 81A changes from the gripped state to the released state, CPU 211 stores an "x" mark indicating that the pair of claw sections 81A interferes with the previously-attached component, reference H1, that is, that the use of holding tool 81 is restricted, in the mounting order field "1" corresponding to the identifier "LC-A" under the "holding tool" category (S19) of mounting order interference data table 309.

On the other hand, when it is determined in S20 that the pair of claw sections of the holding tool gripping the "reference", which is a processing target, does not interfere with the previously-attached electronic component when the pair of claw sections changes from the gripped state to the released state (S20: NO), CPU 211 shifts to the process of S21. In S21, CPU 211 stores, in the "mounting order" field among "holding tool" identifiers in mounting order interference data table 309, which is a processing target, the mark "○" indicating that the pair of claw sections of the holding tool does not interfere with the previously-attached electronic component, that is, there is no restriction on the use of the holding tool.

Figure 19:
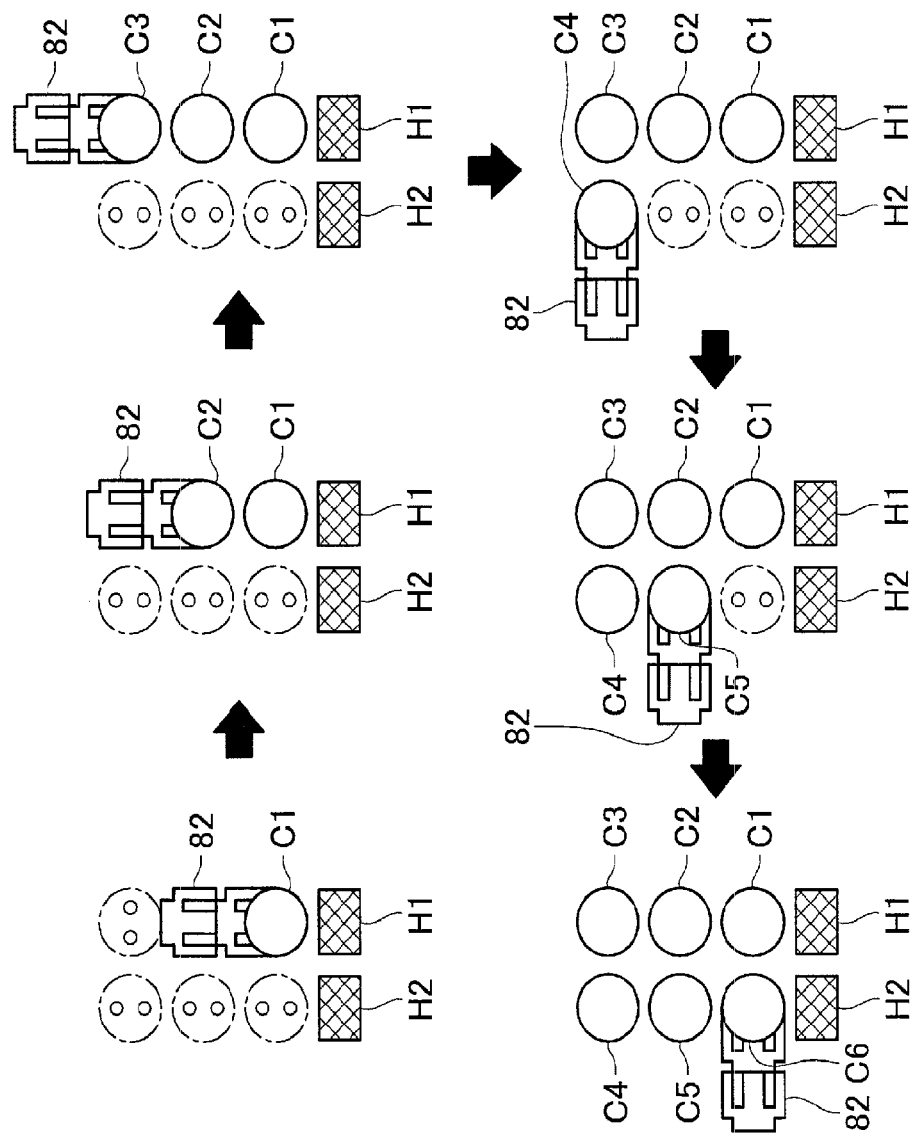
FIG. 19 is a view showing an example of mounting a lead component on a board.

For example, as shown in FIG. 19, when the "holding tool" identifier, which is a processing target, is "LC-B", that is, in the case of holding tool 82, CPU 211 determines that since the first to third "mounting order" references C1 to C3 of mounting order interference data table 309 are held along the X-direction (i.e., the left-right direction in FIG. 19), holding tool 82 swings rearward when the pair of claw sections 82A and auxiliary plate 82B change from the gripped state to the released state and therefore does not interfere with previously-attached electronic components (S20: NO).

Figure 20:
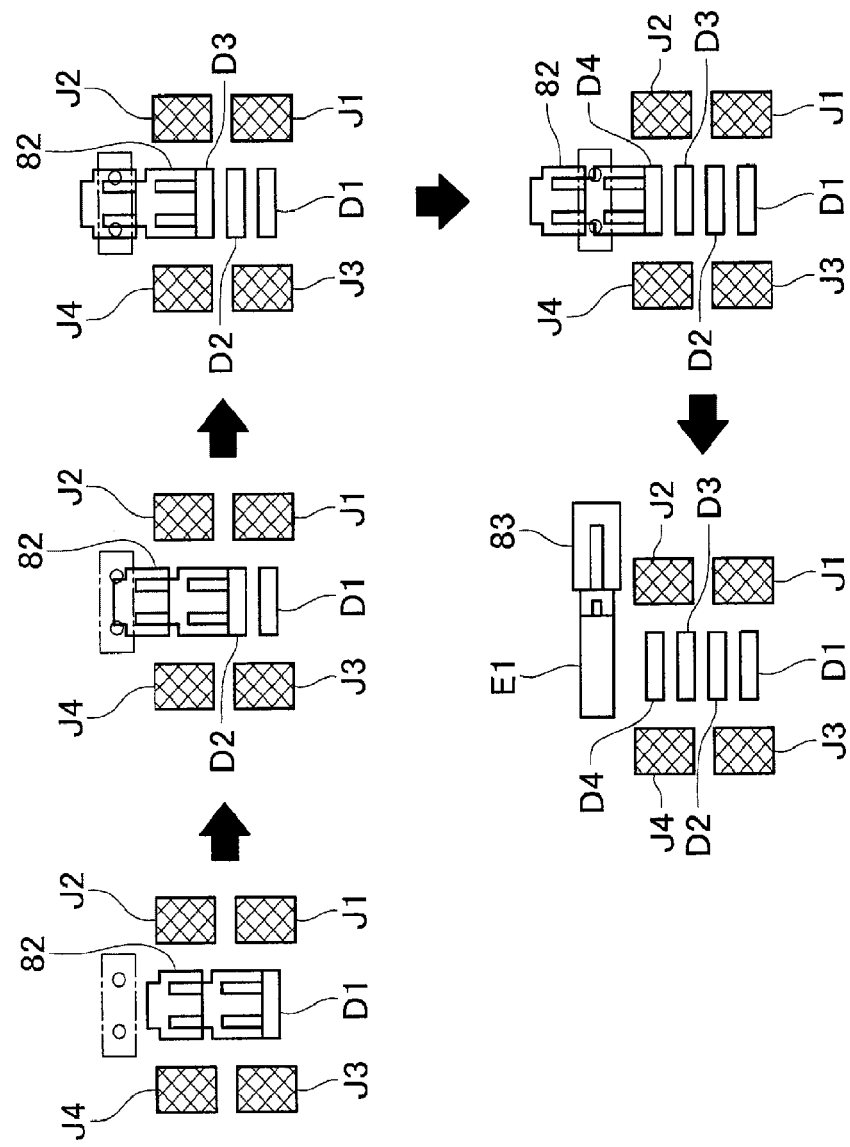
FIG. 20 is a view showing an example of mounting a lead component on a board.

Further, CPU 211 determines that since the fourth to sixth "mounting order" references C4 to C6 of mounting order interference data table 309 are held along the Y-direction (i.e., the up-down direction in FIG. 19), holding tool 82 swings rearward when the pair of claw sections 82A and auxiliary plate 82B change from the gripped state to the released state and therefore does not interfere with previously-attached electronic components (S20: NO), and, as shown in FIG. 20, CPU 211 determines that since the 7th to 10th "mounting order" references D1 to D4 of mounting order interference data table 309 are held along the X-direction (i.e., the left-right direction in FIG. 20), holding tool 82 swings rearward when the pair of claw sections 82A and auxiliary plate 82B change from the gripped state to the released state and therefore do not interfere with previously-attached electronic components (S20: NO).

Then, as shown in FIG. 21, when the pair of claw sections 82A and auxiliary plate 82B are changed from the gripped state to the released state, a mark "o" indicating that they do not interfere with previously-attached electronic components, that is, there is no restriction on the use of holding tool 82 is stored in the field of mounting order interference data table 309 in which the mounting order of the identifier "holding tool" is "LC-B" is "1" to "10" (S 21).

For example, as shown in the lower left side of FIG. 20, when the "holding tool" identifier, which is a processing target, is "LC-C", that is, in the case of holding tool 83, CPU 211 determines that since the 11th "mounting order" reference E1 of mounting order interference data table 309 is held along the X-direction (i.e., the left-right direction in FIG. 20), holding tool 83 swings rearward when the pair of claw sections 83A changes from the gripped state to the released state and therefore does not interfere with previously-attached electronic components (S20: NO). Then, as shown in FIG. 21, when the pair of claw sections 83A is changed from the gripped state to the released state, a mark "□", indicating that the pair of claw sections 83A do not interfere with the previously-attached electronic component, is stored in the field of mounting order interference data table 309 in which the mounting order of the identifier "LC-C" of the "holding tool" category is "11" (S21).

After that, CPU 211 returns to the process of S18, changes to the "reference" of the subsequent "mounting order", which will become a processing target, and then executes the process of S18 and subsequent steps again. Then, when the "reference", which will become a processing target, is the "reference" in the last mounting order, CPU 211 changes the "identifier" of the "holding tool", which will become a processing target, to the "identifier" following the "holding tool" in mounting order interference data table 309, and then executes the processes of S16 and subsequent steps again. When the "identifier" of the "holding tool", which will become a processing target, is the "identifier" in the last order, CPU 211 ends the processes of S16 to S21 and proceeds to the process of S22.

Accordingly, for example, as shown in FIG. 18, when mounting lead components of reference C1 to C6, D1 to D4, and E1 are mounted on mounting board 401, CPU 211 creates mounting interference data table 309 shown in FIG. 21 by executing the processes of S16 to S21 and stores mounting interference data table 309 in RAM 212.

Specifically, when the identifier of the "holding tool" of mounting order interference data table 309 is "LC-A," an "X" mark indicating that there is a limit on the use of holding tool 81 is stored in the first to sixth and eighth to tenth mounting order fields. When the identifier of the "holding tool" is "LC-B", an "x" mark indicating that the use of holding tool 82 is restricted is stored in the eleventh mounting order fields. When the identifier of the "holding tool" is "LC-C", an "X" mark indicating that the use of holding tool 83 is restricted is stored in the 7th to 10th mounting order fields.

On the other hand, when the identifier of the "holding tool" in mounting order interference data table 309 is "LC-A", the mark "□" indicating that the use of holding tool 81 is not restricted is stored in the seventh and eleventh mounting order fields. Further, when the identifier of the "holding tool" of mounting order interference data table 309 is "LC-B," a "□" mark indicating that there is no limit on the use of holding tool 82 is stored in the first to tenth mounting order fields. Further, when the identifier of the "holding tool" of mounting order interference data table 309 is "LC-C," a "□" mark indicating that there is no limit on the use of holding tool 83 is stored in the first to sixth and 11th mounting order fields.

Next, as shown in FIG. 9, in S22, CPU 211 reads out the mounting order interference data table 309 created by executing the processes of S16 to S21 from RAM 212. CPU 211 then determines whether a mark "□" indicating that the use of the holding tool is not restricted has been stored in the field corresponding to all the mounting orders for each of the identifiers "LC-A", "LC-B", "LC-C" and the like of the "holding tool". That is, CPU 211 determines whether any one of holding tools 81 to 83 can mount all the reference lead components on mounting board 401 without being exchanged.

When it is determined that a mark "□" indicating that the use of the holding tool is not restricted has been stored (S22: YES) in the field corresponding to all the mounting orders for each of the identifiers "LC-A", "LC-B", "LC-C" and the like of the "holding tool", CPU 211 proceeds to the process of S23. That is, when it is determined that one of holding tools 81 to 83 can mount all the reference lead components (radial lead components) on mounting board 401 without exchanging (S22: YES), CPU 211 proceeds to the process of S23.

In S23, CPU 211 determines whether the identifiers "LC-A", "LC-B", "LC-C" and the like of the "holding tool" in which an "○" mark, indicating that the use of the holding tool is not restricted, is stored in the columns corresponding to all the mounting orders are obtained for multiple sets of identifiers. That is, CPU 211 determines whether there are multiple holding tools among the holding tools 81-83 that can mount all the reference lead components (radial leads) on mounting board 401 without being exchanged.

When it is determined that only one identifier is stored in the fields corresponding to all the mounting orders among the identifiers "LC-A", "LC-B", "LC-C" and the like of the "holding tool" with a mark "○" indicating that the use of the holding tool is not restricted (S23: NO), the CPU 211 links the one "identifier" with the read components (radial read components) of all the references, that is, after assigning and storing the one "identifier" in RAM 212, shifts to the process of S31 described later. That is, CPU 211 allocates the holding tool corresponding to one "identifier" to all the lead components (radial lead components) of the reference as the mounting holding tool and stores the mounting holding tool in RAM 212, and then shifts to the process of S31, which will be described later.

On the other hand, when it is determined the mark "○", indicating that the use of a holding tool is not restricted has been stored for multiple sets of identifiers (S23: YES) among the identifiers "LC-A", "LC-B", "LC-C", and the like of the "holding tool", is stored in the fields corresponding to all the mounting orders are obtained for multiple sets of identifiers (S23: YES), CPU 211 proceeds to the process of S24.

In S24, for example, for each of the multiple sets of identifiers, CPU 211 sequentially reads out data (shape information) of "part size" corresponding to the part size of each reference in the mounting order from mounting lead component parts data table 303 (see FIG. 13). CPU 211 then further calculates the frequency with which the optimal holding tool can be used based on the read data (shape information) of the "part size" and the relation between the data (shape information) and the holding tool, and selects the "identifier" with the highest usage frequency.

CPU 211 then stores only one of the selected "identifiers" in RAM 212 in association with the respective reference in the mounting order, and then shifts to the process of S31 described later. That is, CPU 211 allocates the holding tool corresponding to one "identifier" to all the lead components (radial lead components) of the reference as the mounting holding tool and stores the mounting holding tool in RAM 212, and then shifts to the process of S31, which will be described later. This makes it possible to further improve the efficiency of mounting the mounting lead component.

On the other hand, when it is determined in S22 that there is no "○" mark stored in the fields corresponding to all the mounting orders among the identifiers "LC-A", "LCB", "LC-C" and the like of the "holding tool" indicating that the use of the holder is not restricted (S22: NO), the CPU 211 proceeds to the process of S25. In S25, CPU 211 determines whether multiple sets of identifiers "LC-A", "LCB", "LC-C", and the like of the "holding tool" are obtained by combining multiple "identifiers", that is, multiple sets of lead components of all references can be mounted on mounting board 401 in the mounting order by exchanging the holding tool.

For example, in mounting order interference data table 309 shown in FIG. 21, CPU 211 obtains a "first combination" in which references C1 to C6 and D1 to D4 of the first to tenth mounting order are mounted by holding tool 82 of the identifier "LC-B" and reference E1 of the 11th mounting order is mounted by holding tool 81 of the identifier "LC-A". Further, CPU 211 obtains a "second combination" in which the first to tenth references C1 to C6 and D1 to D4 are mounted by holding tool 82 of the identifier "LC-B", and the 11th reference E1 is mounted by holding tool 83 of the identifier "LC-C".

Further, CPU 211 obtains a "third combination" in which each of references C1 to C6 in the first to sixth mounting order is mounted by holding tool 83 of the identifier "LC-C", each of references D1 to D4 in the seventh to tenth mounting order is mounted by holding tool 82 of the identifier "LC-B", and reference E1 in the eleventh mounting order is mounted by holding tool 81 of the identifier "LC-A". Further, CPU 211 obtains a "fourth combination" or the like in which each of references C1 to C6 in the first to sixth mounting order is mounted by holding tool 83 of the identifier "LC-C", each of references D1 to D4 in the seventh to tenth mounting order is mounted by holding tool 82 of the identifier "LC-B", and reference E1 in the eleventh mounting order is mounted by holding tool 83 of the identifier "LC-C".

Then, as shown in FIG. 9, when it is determined in S25 that multiple identifiers among the identifiers "LC-A", "LC-B", "LC-C" and the like of the "holding tool" are combined, that is, when it is determined that one set of the lead components of all the references can be mounted on mounting board 401 in the mounting order by exchanging the holding tool (S25: NO), CPU 211 links the identifiers of the holding tools which mount each reference in the mounting order, obtained by combining the multiple "identifiers", with the respective references in the mounting order, that is, allocates and stores the identifiers in RAM 212, and then shifts to the process of S31 described later.

On the other hand, if it is determined in S25 that multiple sets of identifiers "LC-A", "LC-B", "LC-C" and the like of the "holding tool" are combined, that is, multiple sets of lead components of all references can be mounted on mounting board 401 in the mounting order by exchanging the holding tool (S25: YES), CPU 211 proceeds to the process of S26. In S26, CPU 211 determines whether there are multiple sets of combinations having the smallest number of holding tool exchanges among the combinations of multiple sets of holding tools capable of mounting on mounting board 401 all the reference lead components in the mounting order by exchanging the holding tools.

Then, when it is determined that there is only one combination having the smallest number of holding tool exchanges among the combinations of multiple sets of holding tools capable of mounting on mounting board 401 in the mounting order by exchanging holding tools (S26: NO), CPU 211 proceeds to the process of S27.

In S27, CPU 211 selects a combination of holding tools having the smallest number of holding tool exchanges among multiple sets of holding tools capable of mounting all the reference lead components on mounting board 401 in the mounting order by exchanging holding tools. CPU 211 then links the identifiers of the holding tools mounting the respective references in the mounting order with the respective references in the mounting order from the combinations of holding tools having the smallest number holding tool exchanges, that is, CPU allocates and stores the identifiers in RAM 212 and then shifts to the process of S31, which will be described later.

On the other hand, when it is determined that there are multiple sets of holding tools having the smallest number of holding tool exchanges among the combinations of multiple sets of holding tools capable of mounting all the reference lead components on mounting board 401 in the mounting order by exchanging holding tools in S26 (S26: YES), CPU 211 proceeds to the process of S28.

Figure 10:
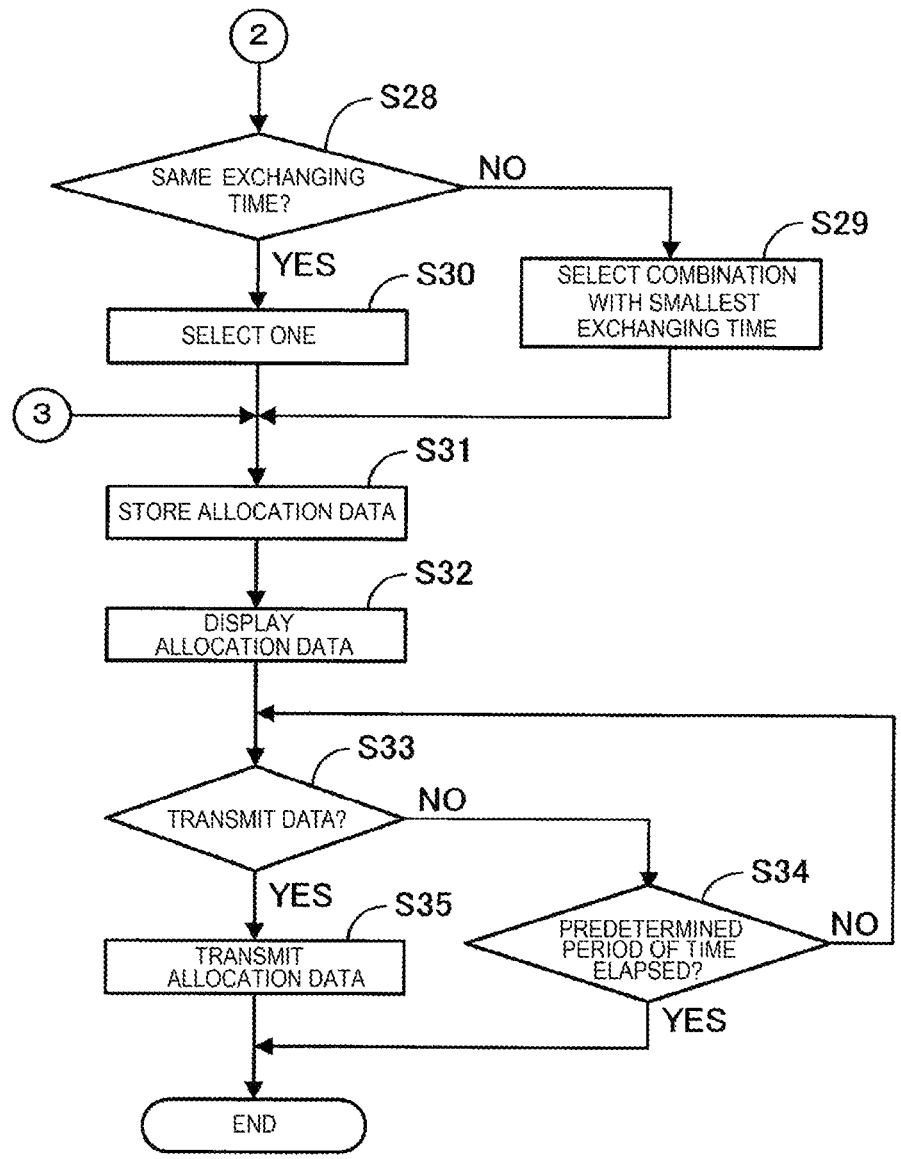
FIG. 10 is a flow chart showing an installation order decision process for determining the installation order of the holding tool.

As shown in FIG. 10, in S28, CPU 211 calculates the time required to exchange each holding tool for each combination having the smallest number of holding tool exchanges among the multiple combinations of holding tools capable of mounting all the reference lead components on mounting board 401 in the mounting order. CPU 211 then determines whether there are multiple combinations having the smallest total holding tool exchanging time among the multiple combinations having the smallest number of holding tool exchanges. CPU 211 calculates the holding tool exchanging time based on data of the storage positions of holding tools 81 to 83 and pushers 88A, 88B, 88C in tool station 85.

When it is determined that only one combination of the multiple combinations having the smallest number of holding tool exchanges is a combination having the smallest total holding tool exchanging time (S28: NO), CPU 211 proceeds to the process of S29.

In S29, CPU 211 selects a combination having the smallest total holding tool exchanging time among multiple combinations in which all the reference lead components can be mounted on mounting board 401 in the mounting order and in which the number of holding tool exchanges is smallest. CPU 211 then links the identifiers of the holding tools mounting the respective references in the mounting order with the respective references in the mounting order, that is, CPU 211 allocates and stores the identifiers in RAM 212 from the combinations having the smallest total holding tool exchanging times and then shifts to the process of S31, which will be described later.

On the other hand, if it is determined in S28 that there are multiple combinations having the smallest total holding tool exchanging time among the multiple combinations having the smallest number of holding time exchanges (S28: Yes), CPU 211 shifts to the process of S30.

In S30, for example, CPU 211 sequentially reads out data (shape information) of "part size" corresponding to the part size of each reference in the mounting order from mounting lead component parts data table 303 (see FIG. 13) for each of multiple combinations having the smallest total holding tool exchanging time. Then, CPU 211 further calculates the frequency with which the optimal holding tool can be used based on the read data (shape information) of the "part size" and the relation between the data (shape information) and the holding tool.

CPU 211 then selects a combination in which the optimum holding tool has the highest reliable frequency from among multiple combinations in which the holding tool exchanging time was the smallest. CPU 211 then links the identifiers of the holding tools mounting the respective references in the mounting order with the respective references in the mounting order, that is, allocates and stores the identifiers in RAM 212 from the combinations of selected holding tools with the shortest exchanging time and then shifts to the process of S31 described later.

In S31, CPU 211 reads out to the mounting order the identifiers of the holding tools, linked to each reference of the mounting order in S23, S24, S25, S27, S29, S30, and stored in RAM 212, and CPU 211 sequentially stores the identifiers in the field of "holding tools" corresponding to the "mounting order" in allocation data table 311 (see FIG. 22), and stores the identifiers in allocation data 235.

Here, allocation data table 311 will be described with reference to FIG. 22. As shown in FIG. 22, allocation data table 311 is a table in which "mounting order", "reference", "part number", "holding tool", and the like are grouped together as a set. The "mounting order", "reference", and "part number" of mounting order interference data table 309 are stored in "mounting order", "reference", and "part number" of allocation data table 311. In "holding tool" of allocation data table 311, identifiers of the holding tools allocated to the respective references in the mounting order in S23, S24, S27, S29, or S30 are sequentially stored in the mounting order.

Specifically, in S29, for example, CPU 211 allocates an identifier "LC-B" of holding tool 82 from mounting order interference data table 309 illustrated in FIG. 21 to each reference C1 to C6 and D1 to D4 in the first to tenth mounting order, and allocates an identifier "LC-C" of holding tool 83 to the 11th reference E1 in the mounting order and stores the identifier "LC-B" in RAM 212. Then, in S31, CPU 211 reads out the data of "mounting order", "reference", and "part number" from the first to eleventh mounting order from mounting order interference data table 309 shown in FIG. 21, and stores the data in "mounting order", "reference", and "part number" from the first to eleventh mounting order of allocation data table 311, as shown in FIG. 22.

Next, CPU 211 sequentially reads the identifier "LC-B" of holding tool 82 or the identifier "LC-C" of holding tool 83 allocated to the first to eleventh references C1 to C6, D1 to D4, E1 in the mounting order from RAM 212. As shown in FIG. 22, they are then sequentially stored in the first to eleventh "holding tools" corresponding to the "mounting order" of allocation data table 311. Thereafter, CPU 211 stores allocation data table 311 in allocation data 235.

As shown in FIG. 10, in S32, CPU 211 then reads allocation data table 311 from allocation data 235 and displays allocation data table 311 on display 215. At the same time, CPU 211 displays transmission buttons (not shown) for accepting a transmission instruction for requesting component mounting machine 10 to transmit data in allocation data table 311. By clicking a transmission button displayed on display 215 with a keyboard, a mouse, or the like, the operator can input a transmission instruction requesting transmission of data from allocation data table 311 to component mounting machine 10.

Next, in S33, CPU 211 determines whether a transmission instruction for requesting data transmission from allocation data table 311 to the component mounting machine 10 has been received via transmission buttons (not shown). When it is determined that a transmission instruction requesting data transmission from allocation data table 311 to component mounting machine 10 has not been received via the transmission buttons (not shown) (S33: NO), CPU 211 proceeds to the process of S34.

In S34, CPU 211 determines whether a predetermined period of time, for example, about 30 seconds, has elapsed since allocation data table 311 was displayed on display 215. When it is determined that a predetermined period of time has not elapsed since allocation data table 311 was displayed on display 215 (S34: NO), CPU 211 executes the processes of S33 and subsequent steps again. On the other hand, if it is determined that a predetermined period has elapsed since allocation data table 311 was displayed on display 215 (S34: Yes), CPU 211 ends the allocation data creation process.

On the other hand, when it is determined that a transmission instruction requesting data transmission from allocation data table 311 to component mounting machine 10 has been received via the transmission buttons (not shown) (S33: YES), CPU 211 proceeds to the process of S35. In S35, CPU 211 reads out data such as allocation data table 311 from allocation data 235, transmits the data as allocation data of the holding tool to component mounting machine 10, and then ends the allocation data creation process. In S35, CPU 211 may transmit job data 230 to component mounting machine 10.

Here, component mounting machine 10 is an example of a mounting machine. Each of holding tools 81 to 83 is an example of a holding tool. Lead component 92 is an example of a lead component. Lead 94 is an example of a lead. Data creation device 200 is an example of a data creation device. CPU 211, RAM 212, and ROM 213 are examples of an mounting data acquisition section, an mounting order determination section, a holding tool extracting section, an mounting order determination section, a data creation section, a first allocation determination section, a second allocation determination section, a third allocation determination section, and a control section. Parts DB 221 is an example of a component data memory section. Holding tool DB 222 is an example of a holding tool data memory section. The process of S15 is an example of an mounting order determination process. The process of S16 to S21 is an example of a holding tool extraction process. The process of S22 to S30 is an example of an installation order determination process. The process of S31 is an example of an allocation data creation process.

As described above in detail, in data creation device 200 of the present embodiment, CPU 211 creates mounting lead component position data table 301, BOM data table 302, parts data table 303, tool data table 305, position data table 306 of previously-attached components, BOM data table 307, and parts data table 308 from CAD data 241, BOM data 242, data stored in parts DB 221, and data stored in holding tool DB 222. CPU 211 then determines the mounting order of the mounting lead components from the respective data of "part size" of mounting lead component position data table 301, BOM data table 302, and mounting lead component parts data table 303.

Next, according to the mounting order of the mounting lead component, CPU 211 determines whether each mounting lead component can be gripped and mounted on mounting board 401 without interfering with previously-attached components from parts data table 303 and tool data table 305 for each of holding tools 81 to 83 to create mounting order interference data table 309. Thereafter, CPU 211 determines the installation order of the holding tools on which all the mounting lead components can be mounted from mounting order interference data table 309 and creates the allocation data table 311. When CPU 211 receives a transmission instruction, CUP 211 transmits the data of allocation data table 311 to component mounting machine 10.

As a result, it is possible to extract each of holding tools 81 to 83 that can be installed for each mounting lead component without interfering with previously-attached components and automatically determine the installation order of each of holding tools 81 to 83 that can install all of the mounting lead components in accordance with the mounting order of the mounting lead components. Accordingly, it is possible to automatically select and assign holding tools 81 to 83 properly that do not interfere with previously-attached components and the like, and it is possible to improve the mounting efficiency of holding the leads of mounting lead components with respective holding tools 81 to 83 and mounting them on circuit substrate 12 (e.g., mounting board 401).

When it is determined that there are multiple installation orders for holding tools 81 to 83 in which all the mounting lead components can be installed, CPU 211 selects the installation order in which the number of times the same holding tool can be used to mount continuously is largest, for example, the installation order in which all the mounting lead components can be installed with the same holding tool and sets this installation order as the installation order of holding tools 81 to 83. In this way, since the installation order in which the number of times the same holding tool can be used to mount continuously is largest is set as the installation order of holding tools 81 to 83, the number of exchanges of holding tools 81 to 83 is reduced, and the mounting efficiency of holding leads of mounting lead components with each of holding tools 81 to 83 and mounting the mounting lead components on circuit substrate 12 (e.g., mounting board 401) can be further increased.

Further, when it is determined that there are multiple cases in which the installation order has the largest number of installation orders in which the same holding tool can be used continuously, CPU 211 selects the installation order in which the number of times holding tools 81 to 83 are exchanged is the smallest and sets the selected installation order as the installation order of holding tools 81 to 83. As a result, since the installation order in which the number of exchanges of each of holding tools 81 to 83 is the smallest is the installation order of holding tools 81 to 83, it is possible to reduce the number of exchanges of each of holding tools 81 to 83, and it is possible to further improve the mounting efficiency with which the leads of the mounting lead component are held by each of holding tools 81 to 83 and mounted on circuit substrate 12 (e.g., mounting board 401).

When it is determined that there are multiple installation orders in which the number of exchanges of each of holding tools 81 to 83 is the smallest, CPU 211 selects the installation order in which the time required for exchanging for each of holding tools 81 to 83 is the smallest and sets the selected installation order as the installation order of each of holding tools 81 to 83. This makes it possible to shorten the time required to exchange each of holding tools 81 to 83, and to further improve the mounting efficiency of holding leads of a mounting lead component with each of holding tools 81 to 83 and mounting them on circuit substrate 12 (e.g., mounting substrate 401).

Further, CPU 211 decides on the mounting order of a mounting lead components so that lead components are mounted in order from smallest to shortest among the lead components to be mounted on circuit substrate 12 (e.g., mounting board 401). This makes it possible to avoid coming in contact with previously-attached components or the like on circuit substrate 12 (e.g., the mounting board 401) when each of holding tools 81 to 83 move and further improve the mounting efficiency of holding the leads of the mounting lead component with holding tools 81 to 83 and mounting the lead component on circuit substrate 12 (e.g., the mounting board 401).

It should be noted that the present disclosure is not limited to the above-mentioned embodiments, and various modifications and variations can be made without departing from the gist of the present disclosure.

For example, controller 100 constituting control device 36 of component mounting machine 10 may store parts DB 221 and holding tool DB 222. The ROM of controller 100 may store a program for executing the allocation data creation process of S11 to S31. The CPU of controller 100 may execute the allocation data creation process of S11 to S31 based on the data of CAD data 241, BOM data 242, parts DB 221, and holding tool DB 222 to create allocation data table 311.

Further, for example, parts DB 221 and holding tool DB 222 may be stored in an external server (not shown), and CPU 211 of data creation device 200 may be configured to receive data stored in parts DB 221 and holding tool DB 222 from the external server via a network connected to communication section 217.

REFERENCE SIGNS LIST

10: Component mounting machine, 81-83: Holding tool, 92: Radial lead component (Lead component), 94: Lead, 200: Data creation device, 211: CPU, 212: RAM, 213: ROM, 221: Parts database (Parts DB), 222: Holding tool database (Holding tool DB)

The invention claimed is:

1. A data creation device configured to create allocation data indicating an installation order of holding tools, which is used in a mounting machine capable of installing any of multiple types of holding tools, the data creation device comprising:
a component data storage section configured to link in advance and store lead component shape data for multiple types of lead components and the multiple types of the holding tools configured to hold leads of the lead components;
a holding tool data storage section configured to store holding tool data including moving directions of the holding tools and clamping directions for holding the lead components;
a mounting data acquisition section configured to acquire mounting data, including the types of the lead components and loading positions on a board, of each of previously-attached components and the lead components;
a mounting order determination section configured to determine a mounting order of the lead components on the board based on the shape data and the mounting data of the lead components;
a holding tool extraction section configured to extract a holding tool of the holding tools, for each of the lead components according to the mounting order determined by the mounting order determination section, without interfering with the previously-attached components based on the holding tool data;
an installation order determination section configured to determine the installation order of holding tools according to the mounting order determined by the mounting order determination section based on the holding tool extracted by the holding tool extraction section; and
an allocation data creation section configured to create the allocation data according to the installation order determined by the installation order determination section.

2. The data creation device of claim 1, wherein the installation order determination section includes a first allocation determination section configured to determine whether there are multiple installation orders of retainers on which all the lead components can be mounted, and
wherein the installation order determination section selects the installation order of the holding tools in which a number of times the same holding tool can be used to mount continuously is the largest, when it is determined that there are multiple installation orders of the holding tools in which all the lead components can be mounted via the first allocation determination section, and sets this installation order as the installation order of the holding tools.

3. The data creation device of claim 2, wherein the installation order determination section comprises:
a second allocation determination section configured to determine whether there are multiple installation orders in which the-number of times the same holding tool can be used to mount continuously is the largest, and
the installation order determination section selects the installation order in which a number of holding tool exchanges is smallest, when it is determined that there are multiple installation orders in which the same holding tool can be used to install continuously via the second allocation determination section, and sets this installation order as the installation order of the holding tools.

4. The data creating device of claim 3, wherein the installation order determination section comprises:
a third allocation determination section configured to determine whether there are multiple installation orders in which the number of holding tool exchanges is smallest, and
the installation order determination section selects the installation order in which the time required for exchanging of the holding tool is the smallest, when it determines that there are multiple installation orders in which the number of holding tool exchanges is the smallest via the third allocation determination section, and sets this installation order as the installation order of the holding tools.

5. The data creation device of claim 1, wherein the mounting order determination section decides on the mounting order so that lead components are mounted in order from smallest and shortest among the lead components to be mounted on the board.

6. A data creation method of creating allocation data indicating an installation order of holding tools, which is used in a mounting machine capable of installing any of multiple types of holding tools, the data creation method comprising:
a component data storage step of linking in advance and storing lead component shape data for multiple types of lead components and the multiple types of the holding tools configured to hold leads of the lead components;
a holding tool data storage step of storing holding tool data including moving directions of the holding tools and clamping directions for holding the lead components;
a mounting data acquisition step of acquiring mounting data, including the types of the lead components and loading positions on a board, of each of previously-attached components and the lead components;
a mounting order determination step of determining a mounting order of the lead components on the board based on the shape data and the mounting data of the lead components;
a holding tool extraction step of extracting a holding tool of the holding tools, for each of the lead components according to the mounting order determined by the mounting order determination step, without interfering with the previously-attached components based on the holding tool data;
an installation order determination step of determining the installation order of the holding tools according to the mounting order determined by the mounting order determination step based on the holding tool extracted by the holding tool extraction step; and an allocation data creation step of creating allocation data according to the installation order determined by the installation order determination step.

\* \* \* \* \*